US012748517B2

(12) United States Patent
Park

(10) Patent No.: US 12,748,517 B2
(45) Date of Patent: Sep. 29, 2026

(54) DISPLAY DEVICE AND ELECTRONIC DEVICE HAVING THE SAME

(71) Applicant: Samsung Display Co., Ltd., Yongin-si (KR)

(72) Inventor: Jongseon Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/096,449

(22) Filed: Mar. 31, 2025

(65) Prior Publication Data

US 2025/0370577 A1 Dec. 4, 2025

(30) Foreign Application Priority Data

Jun. 4, 2024 (KR) ........................ 10-2024-0073064

(51) Int. Cl.

| | |
|---|---|
| ***G06F 3/044*** | (2006.01) |
| ***G06F 3/041*** | (2006.01) |
| ***H10K 59/35*** | (2023.01) |
| ***H10K 59/40*** | (2023.01) |
| ***H10K 59/88*** | (2023.01) |

(52) U.S. Cl.

CPC ........ *G06F 3/0446* (2019.05); *G06F 3/04164* (2019.05); *H10K 59/353* (2023.02); *H10K 59/40* (2023.02); *H10K 59/88* (2023.02)

(58) Field of Classification Search

CPC .. G06F 3/0446; G06F 3/04164; G06F 3/0412; G06F 3/0448; G06F 2203/04111; G06F 3/044; G06F 3/0416; H10K 59/353; H10K 59/40; H10K 59/88; H10K 59/35

See application file for complete search history.

(56) References Cited

U.S. PATENT DOCUMENTS

| | | | |
|---|---|---|---|
| 11,567,605 | B2 | 1/2023 | Cho et al. |
| 11,693,525 | B2 | 7/2023 | Han et al. |
| 11,847,272 | B2 | 12/2023 | Lee et al. |

(Continued)

FOREIGN PATENT DOCUMENTS

| | | | |
|---|---|---|---|
| CN | 114489363 | A | 5/2022 |
| KR | 10-2021-0127295 | A | 10/2021 |

(Continued)

*Primary Examiner* — Brent D Castiaux

(74) *Attorney, Agent, or Firm* — Womble Bond Dickinson (US) LLP

(57) ABSTRACT

A display device includes a display panel and an input sensor. The input sensor includes a first-first sensing electrode and a first-second sensing electrode crossing the first-first sensing electrode. The input sensor includes a second-first sensing electrode facing the first-first sensing electrode and a second-second sensing electrode crossing the second-first sensing electrode. A first dummy electrode is between the first-first sensing electrode and the first-second sensing electrode. Each of a first side edge of the first-first sensing electrode and a first edge of the first dummy electrode that face each other includes a first component and a second component extending in a direction crossing the first component, and each of a first distal edge of the first-first sensing electrode and a second distal edge of the second-first sensing electrode that face each other includes a third component and a fourth component extending in a direction crossing the third component.

20 Claims, 16 Drawing Sheets

(56) References Cited

U.S. PATENT DOCUMENTS

| | | | | |
|---|---|---|---|---|
| 2018/0097039 | A1* | 4/2018 | Jeong .................... | G06F 3/0445 |
| 2021/0325999 | A1* | 10/2021 | Liu ....................... | G06F 3/0446 |
| 2022/0164053 | A1 | 5/2022 | Lee et al. | |

FOREIGN PATENT DOCUMENTS

| | | | |
|---|---|---|---|
| KR | 10-2022-0073302 | A | 6/2022 |
| KR | 10-2022-0076845 | A | 6/2022 |

* cited by examiner

DISPLAY DEVICE AND ELECTRONIC DEVICE HAVING THE SAME

CROSS-REFERENCE TO RELATED APPLICATION

The present application claims priority to and the benefit of Korean Patent Application No. 10-2024-0073064, filed on Jun. 4, 2024, in the Korean Intellectual Property Office, the entire disclosure of which is incorporated herein by reference.

BACKGROUND

Aspects of some embodiments of the present disclosure described herein relate to a display device, and for example, relate to a display device including an input sensor and an electronic device having the display device.

Various display devices used in multimedia devices, such as a television, a mobile phone, a tablet computer, a car navigation unit, a game machine, and the like, are being developed. The display devices include a keyboard or a mouse as an input device. In addition, the display devices include an input sensor, such as a touch panel, as an input device.

The above information disclosed in this Background section is only for enhancement of understanding of the background and therefore the information discussed in this Background section does not necessarily constitute prior art.

SUMMARY

Aspects of some embodiments of the present disclosure include a display device with relatively improved display quality.

Aspects of some embodiments of the present disclosure include an electronic device having the display device.

According to some embodiments, a display device includes a display panel including first color light emitting areas, second color light emitting areas, third color light emitting areas, and a non-light emitting area around the first to third color light emitting areas and an input sensor that is on the display panel and that includes a first sensing area and a second sensing area. According to some embodiments, the input sensor includes a first-first sensing electrode that is in the first sensing area and that overlaps corresponding light emitting areas among the first to third color light emitting areas, a first-second sensing electrode that is in the first sensing area and that crosses the first-first sensing electrode, a second-first sensing electrode in the second sensing area and spaced apart from the first-first sensing electrode, a second-second sensing electrode that is in the second sensing area and that crosses the second-first sensing electrode, and a first dummy electrode between a first side edge of the first-first sensing electrode and a first side edge of the first-second sensing electrode. According to some embodiments, the first dummy electrode includes a first edge that faces the first side edge of the first-first sensing electrode, and each of the first side edge of the first-first sensing electrode and the first edge of the first dummy electrode includes a first component and a second component that extends in a direction crossing the first component. According to some embodiments, each of a first distal edge of the first-first sensing electrode and a second distal edge of the second-first sensing electrode that face each other includes a third component and a fourth component that extends in a direction crossing the third component.

According to some embodiments, the first dummy electrode may include a plurality of dummy parts spaced apart from one another, and an edge of at least one dummy part among the plurality of dummy parts may include the first component and the second component.

According to some embodiments, the first dummy electrode may include a second edge that faces the first side edge of the first-second sensing electrode, and each of the second edge of the first dummy electrode and the first side edge of the first-second sensing electrode may include the first component and the second component.

According to some embodiments, the first side edge of the first-first sensing electrode may include a plurality of first components and a plurality of second components, and the plurality of first components and the plurality of second components of the first side edge of the first-first sensing electrode may alternate with one another.

According to some embodiments, the display device may further include a second dummy electrode between the first distal edge and the second distal edge. According to some embodiments, the second dummy electrode may include a third edge that faces the first distal edge, and the third edge may include the third component and the fourth component.

According to some embodiments, the second dummy electrode may further include a fourth edge that faces the second distal edge, and each of the fourth edge and the second distal edge may include the third component and the fourth component.

According to some embodiments, the first-first sensing electrode and the second dummy electrode may include transparent conductive oxide.

According to some embodiments, the second dummy electrode may include a plurality of dummy parts spaced apart from one another, and an edge of at least one dummy part among the plurality of dummy parts may include the third component and the fourth component.

According to some embodiments, the second dummy electrode may include a plurality of dummy parts spaced apart from one another, and an edge of one dummy part among the plurality of dummy parts may include the third component and the fourth component.

According to some embodiments, each of the first side edge of the first-first sensing electrode and the first side edge of the first-second sensing electrode may overlap corresponding light emitting areas among the first to third color light emitting areas, and each of the first distal edge and the second distal edge may overlap corresponding light emitting areas among the first to third color light emitting areas.

According to some embodiments, the first-first sensing electrode and the first dummy electrode may include transparent conductive oxide.

According to some embodiments, the first-first sensing electrode or the first-second sensing electrode may include an inner edge that defines a dummy opening inside, and the inner edge may include the third component and the fourth component.

According to some embodiments, the display device may further include an inner dummy electrode in the dummy opening.

According to some embodiments, an edge of the inner dummy electrode that faces the inner edge may include the third component and the fourth component.

According to some embodiments, a difference between included angles of the first component and the second component with respect to a reference axis may be the same as a difference between included angles of the third component and the fourth component with respect to the reference axis.

According to some embodiments, the display device may further include a first sensor drive circuit electrically connected to the first-first sensing electrode and the first-second sensing electrode and a second sensor drive circuit electrically connected to the second-first sensing electrode and the second-second sensing electrode.

According to some embodiments, a display device includes a display panel including first color light emitting areas, second color light emitting areas, third color light emitting areas, and a non-light emitting area around the first to third color light emitting areas and an input sensor that is on the display panel and that includes a first sensing area and a second sensing area. According to some embodiments, the input sensor includes a first-first sensing electrode that is in the first sensing area and that overlaps corresponding light emitting areas among the first to third color light emitting areas, a second-first sensing electrode in the second sensing area and spaced apart from the first-first sensing electrode, and a dummy electrode between a first distal edge of the first-first sensing electrode and a second distal edge of the second-first sensing electrode that face each other. According to some embodiments, each of the first distal edge and the second distal edge includes a first component and a second component that extended in a direction crossing the first component. The dummy electrode includes a first edge that faces the first distal edge, and the first edge of the dummy electrode includes the first component and the second component.

According to some embodiments, the dummy electrode may include a second edge that faces the second distal edge, and the second edge of the dummy electrode may include the first component and the second component.

According to some embodiments, the first-first sensing electrode, the second-first sensing electrode, and the dummy electrode may include transparent conductive oxide.

According to some embodiments, the first distal edge, the second distal edge, and the first edge of the dummy electrode may overlap corresponding light emitting areas among the first to third color light emitting areas.

BRIEF DESCRIPTION OF THE DRAWINGS

The above and other aspects and features of some embodiments of the present disclosure will become more apparent by describing in more detail aspects of some embodiments thereof with reference to the accompanying drawings.

DETAILED DESCRIPTION

Figure 1A:
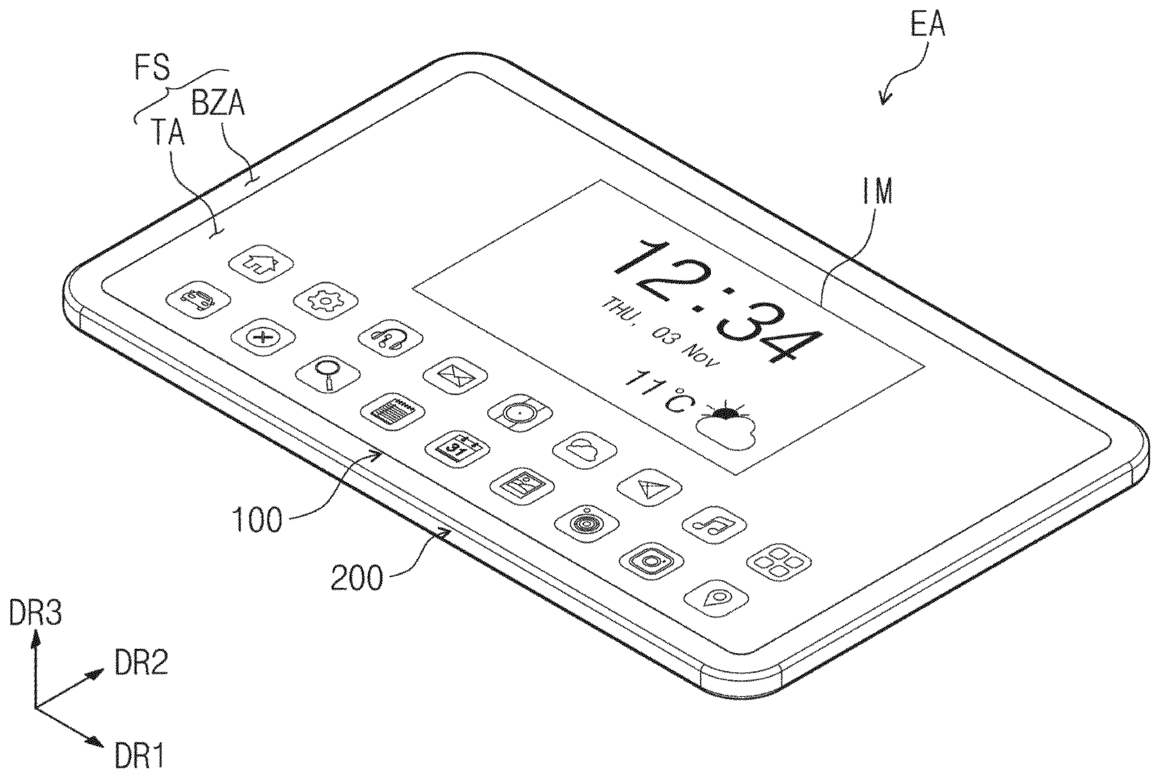
FIG. 1A is a perspective view of an electronic device according to some embodiments of the present disclosure.

In this specification, when a component (or, an area, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship between components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, aspects of some embodiments of the present disclosure will be described in more detail with reference to the accompanying drawings.

Figure 1B:
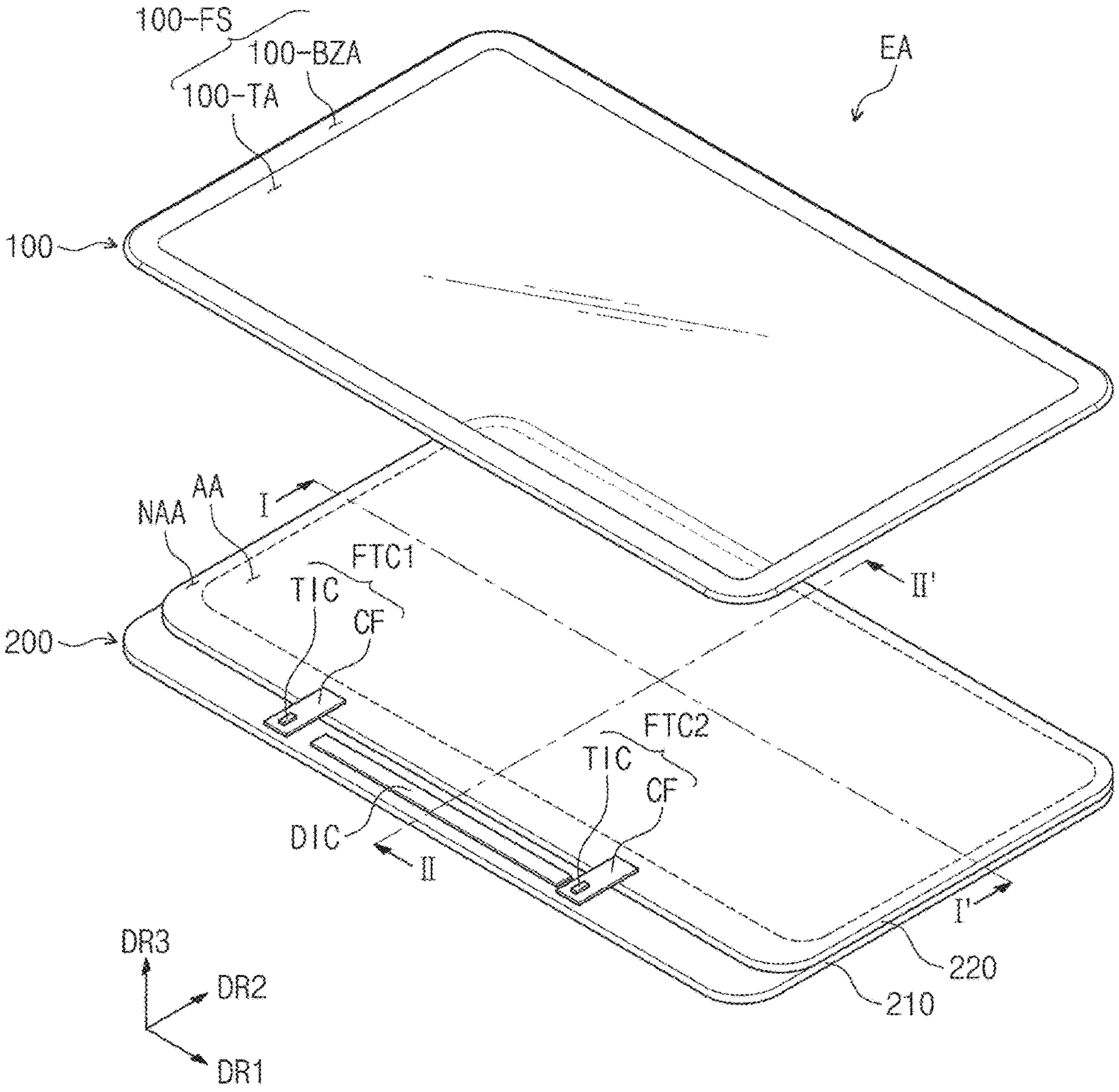
FIG. 1B is an exploded perspective view of the electronic device illustrated in FIG. 1A.
Figure 1C:
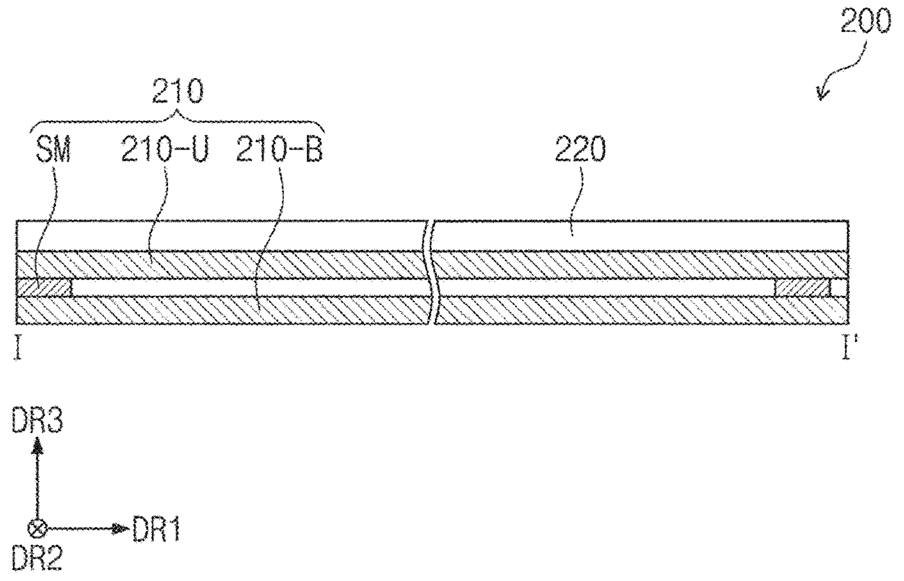
FIG. 1C is a sectional view of a display device corresponding to line I-I' of FIG. 1B.
Figure 1D:
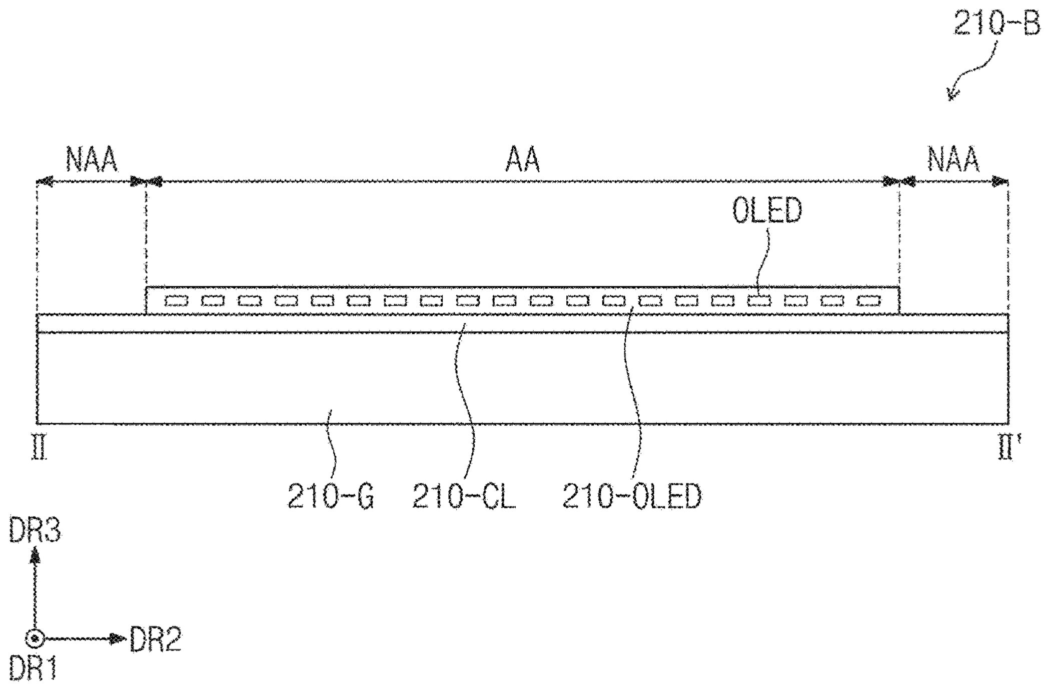
FIG. 1D is a sectional view of a display substrate corresponding to line II-II' of FIG. 1B.

FIG. 1A is a perspective view of an electronic device EA according to some embodiments of the present disclosure. FIG. 1B is an exploded perspective view of the electronic device EA illustrated in FIG. 1A. FIG. 1C is a sectional view corresponding to line I-I' of FIG. 1B. FIG. 1D is a sectional view of a display substrate 210-B corresponding to the line II-II' of FIG. 1B. Hereinafter, the electronic device EA according to some embodiments will be described with reference to FIGS. 1A to 1D.

Referring to FIG. 1A, the electronic device EA may be a device activated depending on an electrical signal. The electronic device EA may include, for example, a tablet computer, a notebook computer, a computer, a smart television, a display for a vehicle, or the like. According to some embodiments, the electronic device EA is illustrated as a tablet computer.

The electronic device EA may display an image IM through a display surface FS. The display surface FS is parallel to a plane defined by a first direction DR1 and a second direction DR2. The normal direction of the display surface FS, that is, the thickness direction of the electronic device EA is indicated by a third direction DR3. Front surfaces (or, upper surfaces) and rear surfaces (or, lower surfaces) of members or units that will be described below are distinguished from each other based on the third direction DR3. Although the flat display surface FS is illustrated in FIG. 1A, embodiments according to the present disclosure are not limited thereto. The display surface FS may be a curved surface having a certain curvature with respect to a reference axis extending in the same direction as the first direction DR1.

The display surface FS includes a display area TA and a bezel area BZA. The display area TA displays the image IM, and the bezel area BZA does not display the image IM. In FIG. 1A, a clock and a plurality of icons are illustrated as an example of the image IM. The display surface FS may correspond to the front surface of the electronic device EA and may be provided by a front surface 100-FS of a window member 100 that will be described below with reference to FIG. 1B.

Referring to FIG. 1B, the electronic device EA includes the window member 100 and a display device 200. According to some embodiments, the electronic device EA may further include an optical member between the window member 100 and the display device 200. The optical member may include a polarizer. According to some embodiments of the present disclosure, the optical member may include a color filter member that lowers the reflectance of external light.

The window member 100 includes a base substrate. For example, the base substrate may be implemented with glass, plastic, or a combination thereof. The front surface 100-FS of the window member 100 includes a transmissive area 100-TA and a non-transmissive area 100-BZA. The transmissive area 100-TA may be an optically clear area. For example, the transmissive area 100-TA may be an area having a visible light transmittance of 90% (or about 90%) or more.

The non-transmissive area 100-BZA may be an area having a lower light transmittance than the transmissive area 100-TA. The non-transmissive area 100-BZA defines the shape of the transmissive area 100-TA. The non-transmissive area 100-BZA may be adjacent to the transmissive area 100-TA and may surround the transmissive area 100-TA. The window member 100 may include a light blocking pattern that is located on the base substrate and that defines the non-transmissive area 100-BZA.

The display device 200 may generate the image IM (refer to FIG. 1A) and may sense an external input. The display device 200 includes an active area AA and a peripheral area NAA. The active area AA may be an area activated depending on an electrical signal. According to some embodiments, the active area AA may be an area where the image IM (refer to FIG. 1A) is generated and the external input is sensed at the same time. The active area AA corresponds to the transmissive area 100-TA, and the peripheral area NAA corresponds to the non-transmissive area 100-BZA. The expression "one area/portion corresponds to another area/portion" used herein means that "the areas/portions overlap each other", but is not limited to having the same area and/or the same shape.

Referring to FIGS. 1B and 1C, the display device 200 includes a display panel 210, an input sensor 220, a drive circuit DIC, and first and second circuit modules FTC1 and FTC2.

The display panel 210 may be an organic light emitting display panel or an inorganic light emitting display panel. The panels are distinguished from each other based on constituent materials of light emitting elements. A light emitting layer of the organic light emitting display panel may include an organic luminescent material. A light emitting layer of the inorganic light emitting display panel may include quantum dots and/or quantum rods. Hereinafter, it will be illustrated that the display panel 210 is an organic light emitting display panel.

The input sensor 220 senses an external input applied from the outside. The external input may be a touch of a user or an input of a stylus pen. According to some embodiments, the input sensor 220 may be a capacitive touch sensor and is not particularly limited.

The drive circuit DIC is located on the display panel 210. The drive circuit DIC is electrically connected to the display panel 210 and provides, to the display panel 210, an electrical signal for driving the display panel 210.

The first and second circuit modules FTC1 and FTC2 are electrically connected to the input sensor 220. The first and second circuit modules FTC1 and FTC2 drive sensing electrodes located in different sensing areas of the input sensor 220. According to some embodiments, each of the first and second circuit modules FTC1 and FTC2 may include a flexible circuit board CF and a sensor drive circuit TIC. The flexible circuit board CF includes an insulting layer and a plurality of lines. The lines electrically connect the input sensor 220 and the sensor drive circuit TIC. The sensor drive circuit TIC may be mounted on the flexible circuit board CF in the form of a chip-on film.

The first and second circuit modules FTC1 and FTC2 may connect the input sensor 220 and the display panel 210. The sensor drive circuit TIC may be omitted. According to some embodiments of the present disclosure, the sensor drive circuit TIC and the drive circuit DIC may be integrated.

Referring to FIG. 1C, the display panel 210 includes the display substrate 210-B, an encapsulation substrate 210-U, and a sealing member SM that bonds the display substrate 210-B and the encapsulation substrate 210-U. The display substrate 210-B includes pixels that generate images. The encapsulation substrate 210-U seals the pixels and prevents damage to the pixels due to external moisture, oxygen, or the like.

The display substrate 210-B and the encapsulation substrate 210-U may include a glass substrate as a base substrate. Referring to FIGS. 1B and 1C, the display substrate 210-B may have a larger area than the encapsulation substrate 210-U. The drive circuit DIC of FIG. 1B may be coupled to the display substrate 210-B. The encapsulation substrate 210-U may have the same (or substantially the same) area as the input sensor 220 of FIG. 1B. However, without being limited thereto, the display substrate 210-B and the encapsulation substrate 210-U may have the same (or substantially the same) shape according to some embodiments of the present disclosure.

The sealing member SM may include, for example, a frit. The frit is a ceramic adhesive material and has a property of being cured after exposed to light. The frit may include 15 wt % to 40 wt % of $V_2O_5$, 10 wt % to 30 wt % of $TeO_2$, 1 wt % to 15 wt % of $P_2O_5$, 1 wt % to 15 wt % of BaO, 1 wt % to 20 wt % of ZnO, 5 wt % to 30 wt % of $ZrO_2$, 5 wt % to 20 wt % of $WO_3$, and 1 wt % to 15 wt % of BaO as main ingredients and may include at least one of $Fe_2O_3$, CuO, MnO, $AL_2O_3$, $Na_2O$, or $Nb_2O_5$ as an additive. The sealing member SM overlaps the peripheral area NAA.

Referring to FIG. 1D, the display substrate 210-B includes a base substrate 210-G, a circuit element layer 210-CL located on the base substrate 210-G, and a display element layer 210-OLED located on the circuit element layer 210-CL. The display substrate 210-B may further include a capping layer or an encapsulation layer that covers the display element layer 210-OLED. In FIG. 1D, the drive circuit DIC of FIG. 1B is not illustrated.

The base substrate 210-G may include a glass substrate, a metal substrate, or an organic/inorganic composite substrate. The circuit element layer 210-CL includes at least one insulating layer and a circuit element. The insulating layer includes at least one inorganic layer and at least one organic layer. The circuit element includes signal lines and a pixel drive circuit. The pixel drive circuit may be provided for each of the pixels. The display element layer 210-OLED may include a light emitting element OLED. The light emitting element OLED may be provided for each of the pixels. Under the control of the pixel drive circuit, the light emitting element OLED may be turned on/off, and the luminance of light may be determined. The light emitting element OLED may include an organic light emitting diode.

Figure 2:
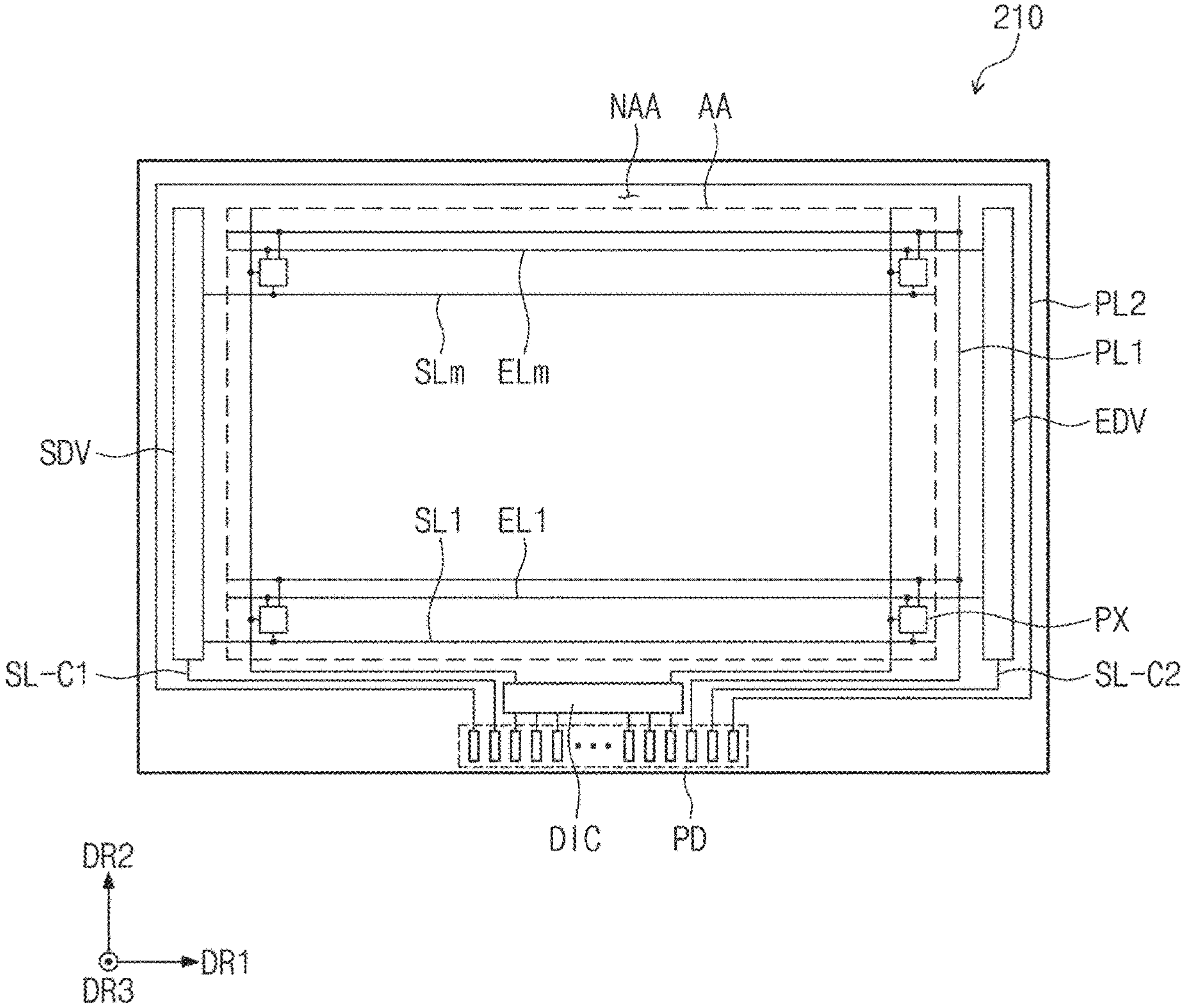
FIG. 2 is a plan view of a display panel according to some embodiments of the present disclosure.

FIG. 2 is a plan view of the display panel 210 according to some embodiments of the present disclosure.

Referring to FIG. 2, the display panel 210 may include a plurality of pixels PX, a scan drive circuit SDV, a light emission drive circuit EDV, a plurality of signal lines, and a plurality of pads PD. The plurality of pixels PX are located in the active area AA. The drive circuit DIC mounted on the peripheral area NAA may include a data drive circuit.

The plurality of signal lines may include a plurality of scan lines SL1 to SLm, a plurality of data lines DL1 to DLn, a plurality of light emission lines EL1 to ELm, first and second control lines SL-C1 and SL-C2, and first and second power lines PL1 and PL2. Here, “m” and “n” are natural numbers of 2 or more.

The scan lines SL1 to SLm may extend in the first direction DR1 and may be electrically connected to the pixels PX and the scan drive circuit SDV. The data lines DL1 to DLn may extend in the second direction DR2 and may be electrically connected to the pixels PX and the drive circuit DIC. The light emission lines EL1 to ELm may extend in the first direction DR1 and may be electrically connected to the pixels PX and the light emission drive circuit EDV.

The first power line PL1 receives a first power voltage, and the second power line PL2 receives a second power voltage having a lower level than the first power voltage. According to some embodiments, a second electrode (e.g., a cathode) of a light emitting element is connected to the second power line PL2.

The first control line SL-C1 may be connected to the scan drive circuit SDV and may extend toward the lower end of the display panel 210. The second control line SL-C2 may be connected to the light emission drive circuit EDV and may extend toward the lower end of the display panel 210. The pads PD may be located in the peripheral area NAA adjacent to the lower end of the display panel 210 and may be closer to the lower end of the display panel 210 than the drive circuit DIC. The pads PD may be connected to the drive circuit DIC and some of the signal lines.

The scan drive circuit SDV may generate a plurality of scan signals, and the scan signals may be applied to the pixels PX through the scan lines SL1 to SLm. The drive circuit DIC may generate a plurality of data voltages, and the data voltages may be applied to the pixels PX through the data lines DL1 to DLn. The light emission drive circuit EDV may generate a plurality of light emission signals, and the light emission signals may be applied to the pixels PX through the light emission lines EL1 to ELm. The pixels PX may receive the data voltages in response to the scan signals. The pixels PX may display an image by emitting light having luminance corresponding to the data voltages in response to the light emission signals.

Figure 3:
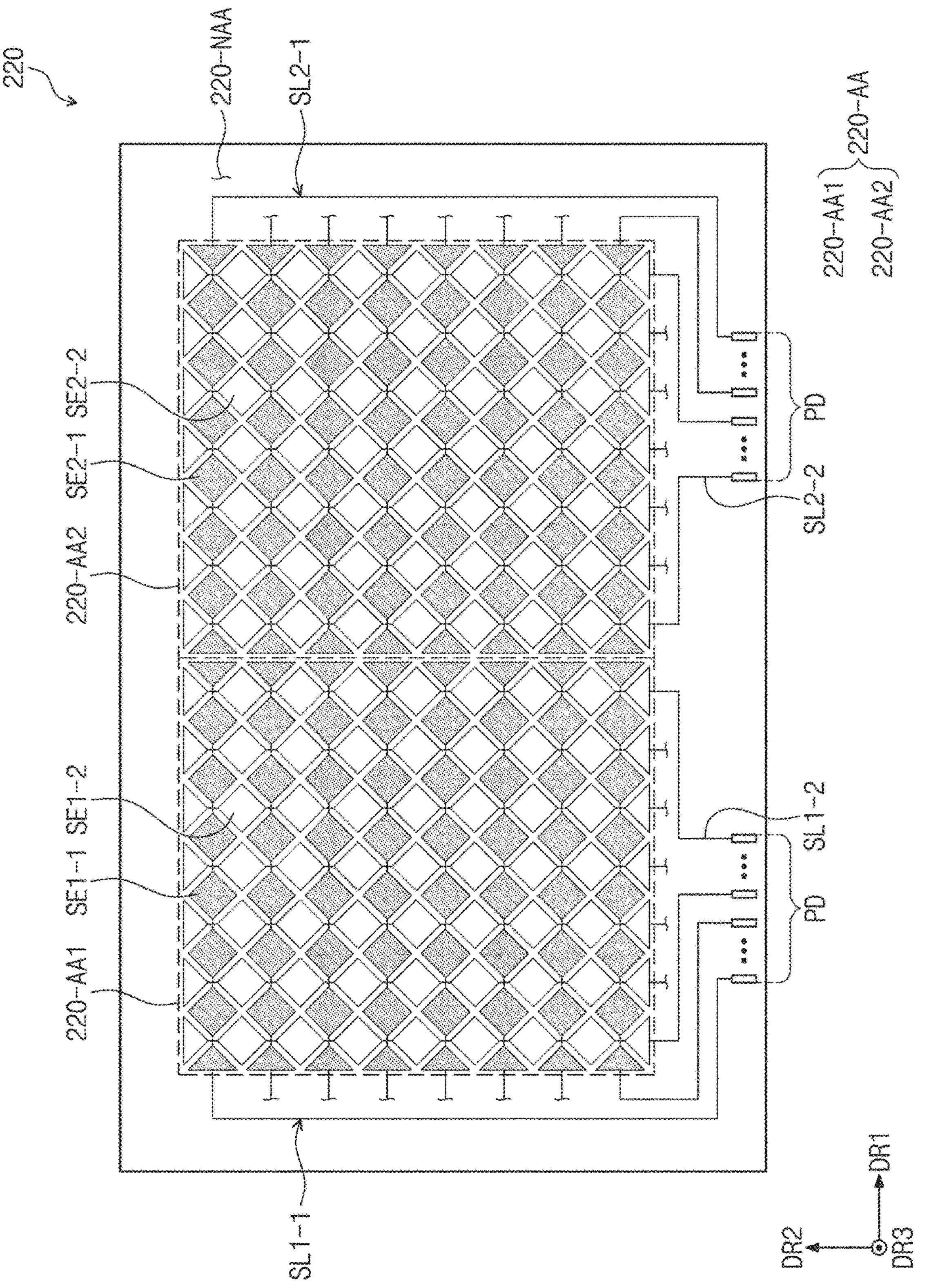
FIG. 3 is a plan view of an input sensor according to some embodiments of the present disclosure.

FIG. 3 is a plan view of the input sensor 220 according to some embodiments of the present disclosure. A sensing area 220-AA and a non-sensing area 220-NAA of the input sensor 220 that correspond to the active area AA and the peripheral area NAA of the display panel 210 of FIG. 2 are illustrated in FIG. 3. The sensing area 220-AA and the non-sensing area 220-NAA are defined on the upper surface of the encapsulation substrate 210-U of FIG. 1C.

The sensing area 220-AA may include a plurality of sensing areas individually driven by the plurality of sensor drive circuits TIC (refer to FIG. 1B). In FIG. 3, a first sensing area 220-AA1 and a second sensing area 220-AA2, that is, two sensing areas are illustrated as an example.

The input sensor 220 may include a plurality of first sensing electrodes SE1-1 and SE1-2 located in the first sensing area 220-AA1 and a plurality of second sensing electrodes SE2-1 and SE2-2 located in the second sensing area 220-AA2. The plurality of first sensing electrodes SE1-1 and SE1-2 include a first-first sensing electrode SE1-1 and a first-second sensing electrode SE1-2 crossing the first-first sensing electrode SE1-1. A plurality of first-first sensing electrodes SE1-1 and a plurality of first-second sensing electrodes SE1-2 may be provided. The first-first sensing electrodes SE1-1 that extend in the first direction DR1 and the first-second sensing electrodes SE1-2 that extend in the second direction DR2 are illustrated as an example.

The input sensor 220 may include a first-first signal line SL1-1 connected to the first-first sensing electrode SE1-1 and a first-second signal line SL1-2 connected to the first-second sensing electrode SE1-2. A plurality of first-first signal lines SL1-1 and a plurality of first-second signal lines SL1-2 may be provided. Each of the first-first signal lines SL1-1 and the first-second signal lines SL1-2 is connected to a corresponding pad PD.

The plurality of second sensing electrodes SE2-1 and SE2-2 include a second-first sensing electrode SE2-1 and a second-second sensing electrode SE2-2 crossing the second-first sensing electrode SE2-1. A plurality of second-first sensing electrodes SE2-1 and a plurality of second-second sensing electrodes SE2-2 may be provided. The second-first sensing electrodes SE2-1 that extend in the first direction DR1 and the second-second sensing electrodes SE2-2 that extend in the second direction DR2 are illustrated as an example.

The input sensor 220 may include a second-first signal line SL2-1 connected to the second-first sensing electrode SE2-1 and a second-second signal line SL2-2 connected to the second-second sensing electrode SE2-2. A plurality of second-first signal lines SL2-1 and a plurality of second-second signal lines SL2-2 may be provided. The second-first signal lines SL2-1 and the second-second signal lines SL2-2 may be located in the non-sensing area 220-NAA.

The plurality of first sensing electrodes SE1-1 and SE1-2 located in the first sensing area 220-AA1 are driven by the sensor drive circuit TIC (hereinafter, referred to as the first sensor drive circuit) located in the first circuit module FTC1 of FIG. 1B. The plurality of second sensing electrodes SE2-1 and SE2-2 located in the second sensing area 220-AA2 are driven by the sensor drive circuit TIC (hereinafter, referred to as the second sensor drive circuit) located in the second circuit module FTC2 of FIG. 1B. The first circuit module FTC1 and the second circuit module FTC2 may be driven in synchronization with each other, or may be driven independently of each other.

According to some embodiments, the first-first sensing electrodes SE1-1 may receive a drive signal from the first circuit module FTC1, and the second-first sensing electrodes SE2-1 may receive a drive signal from the second circuit module FTC2 (hereinafter, referred to as a TX electrode function). The first circuit module FTC1 may receive detection signals from the first-second sensing electrodes SE1-2, and the second circuit module FTC2 may receive detection signals from the second-second sensing electrodes SE2-2 (hereinafter, referred to as an RX electrode function). The first and second sensor drive circuits TIC may measure a change in the mutual capacitance between the electrodes through the detection signals.

The second-first sensing electrodes SE2-1 may be spaced apart from the first-first sensing electrodes SE1-1 in a one-to-one correspondence. Each of the second-first sensing electrodes SE2-1 may be aligned with a corresponding electrode among the first-first sensing electrodes SE1-1 in the first direction DR1. The first-first sensing electrode SE1-1 and the second-first sensing electrode SE2-1 corresponding to each other are the same as two electrodes into which one electrode extending in the first direction DR1 is divided. As the length of one electrode is increased, RC delay may be increased, and touch sensitivity may be decreased accordingly. According to some embodiments, the input sensor 220 may include the electrodes divided from each other in the long axis direction and thus may suppress a deterioration in the RC delay and the touch sensitivity.

According to some embodiments, each of the first-first sensing electrodes SE1-1 and the second-first sensing electrodes SE2-1 may include a plurality of first sensing parts SP1 and a plurality of first intermediate parts BP1 arranged in the first direction DR1. Each of the plurality of first intermediate parts BP1 connects two first sensing parts SP1 adjacent to each other among the plurality of first sensing parts SP1. Each of the first-second sensing electrodes SE1-2 and the second-second sensing electrodes SE2-2 may include a plurality of second sensing parts SP2 and a plurality of second intermediate parts BP2 arranged in the second direction DR2.

Figure 4A:
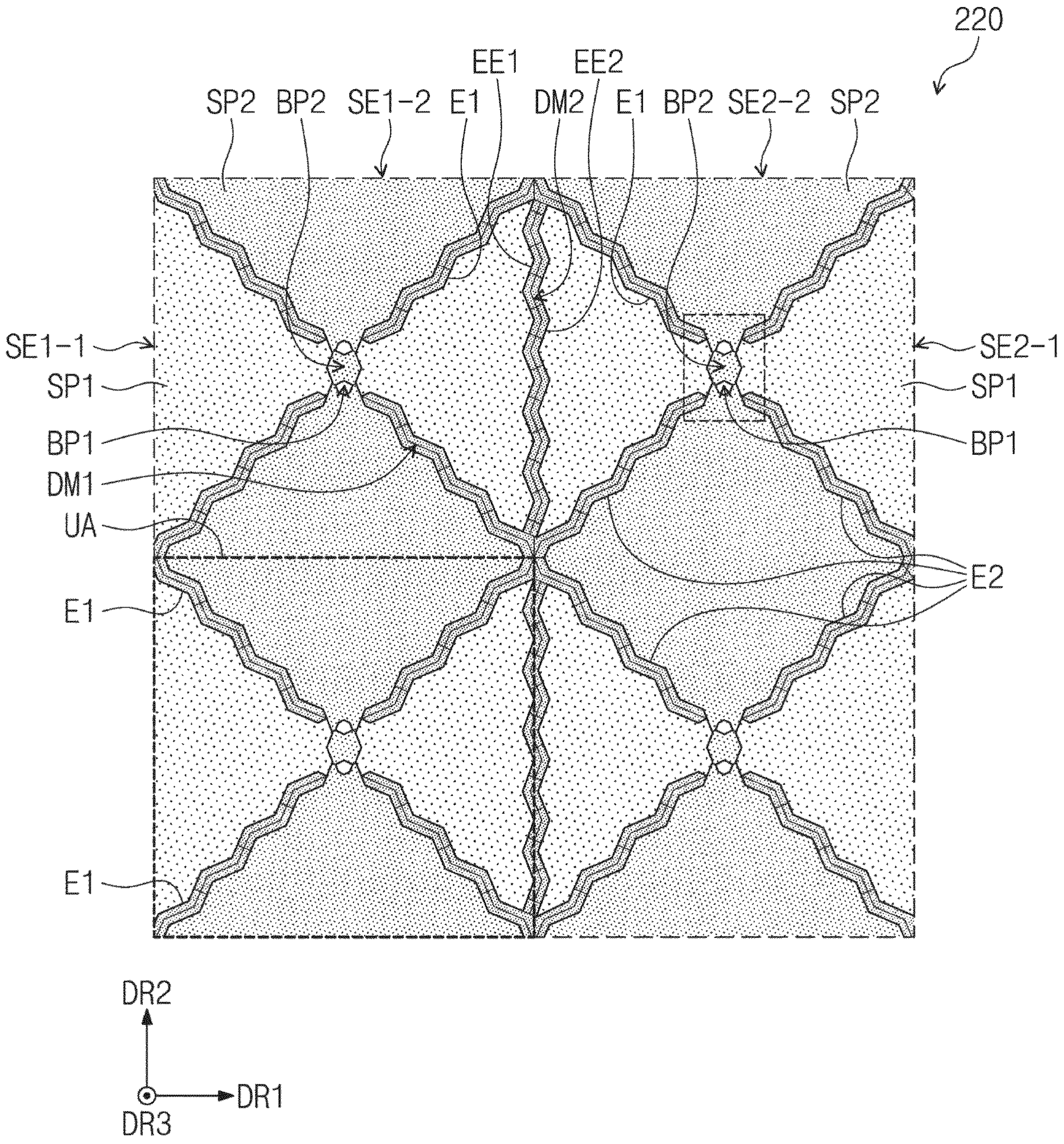
FIG. 4A is a plan view illustrating a partial area of the input sensor according to some embodiments of the present disclosure.
Figure 4B:
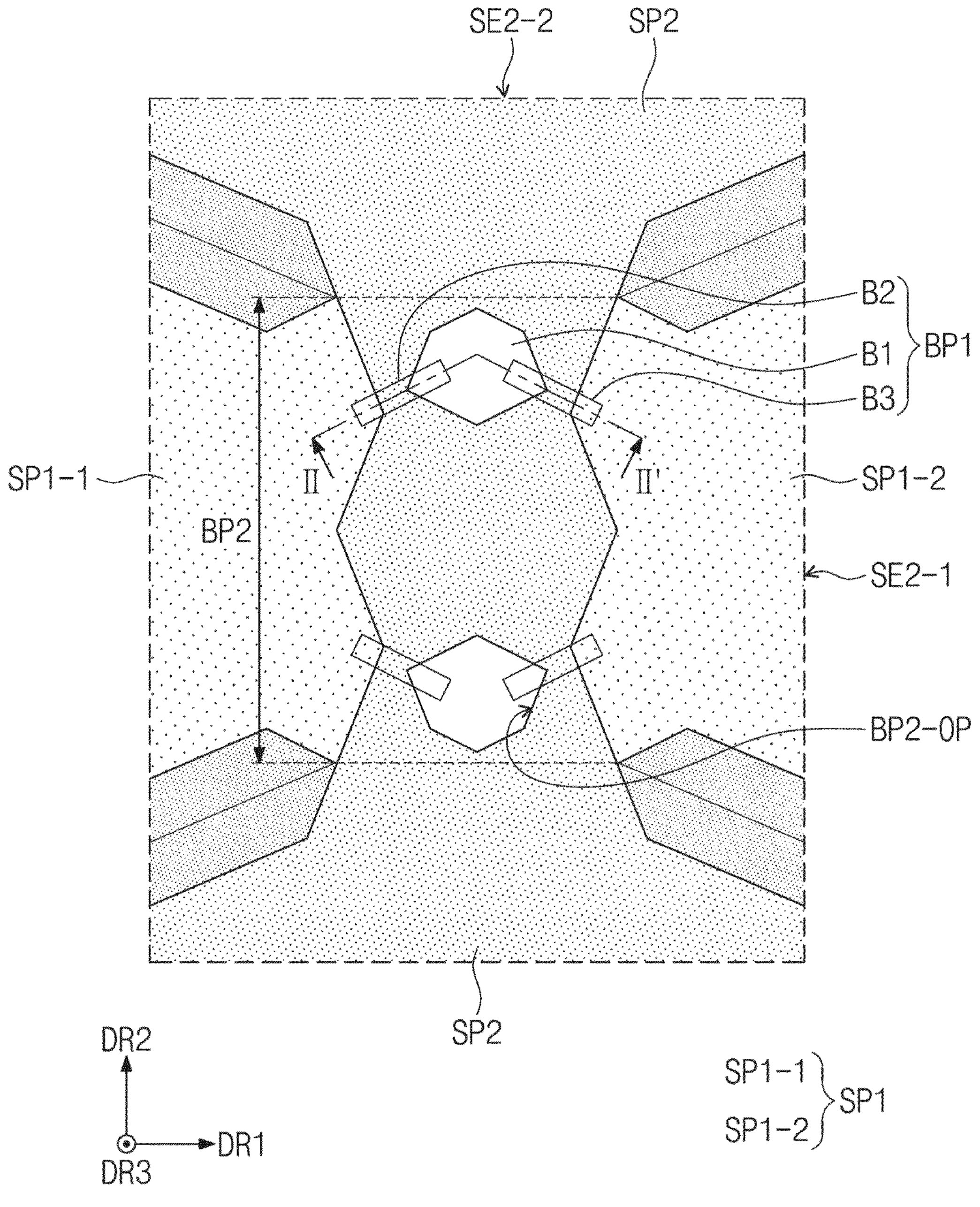
FIG. 4B is an enlarged plan view of a partial area of FIG. 4A.
Figure 4C:
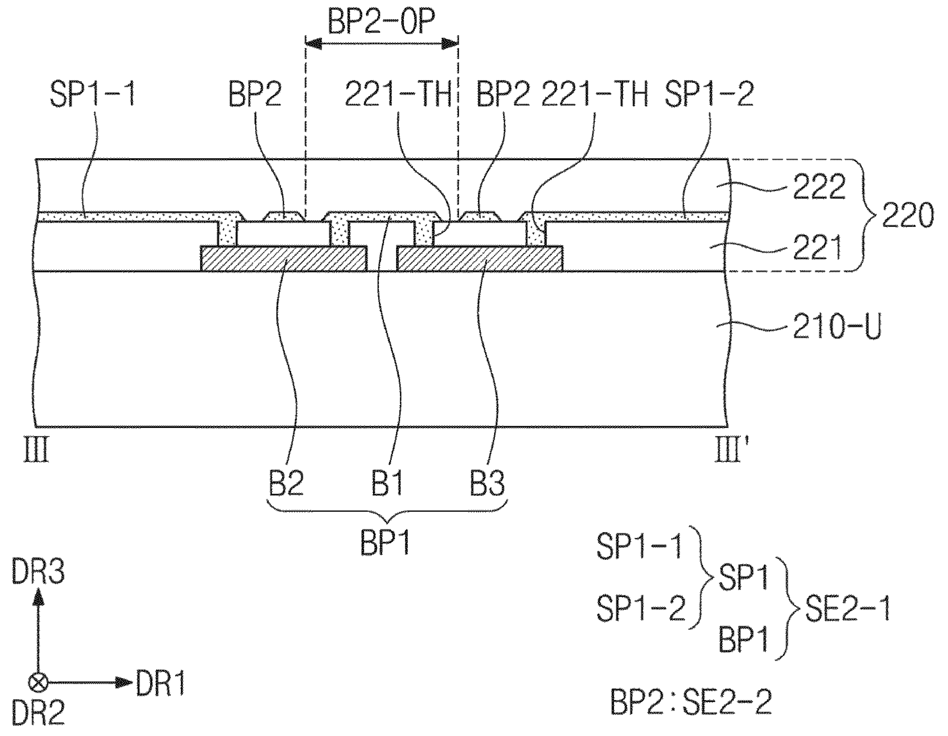
FIG. 4C is a sectional view corresponding to the line III-III' in FIG. 4B.
Figure 4D:
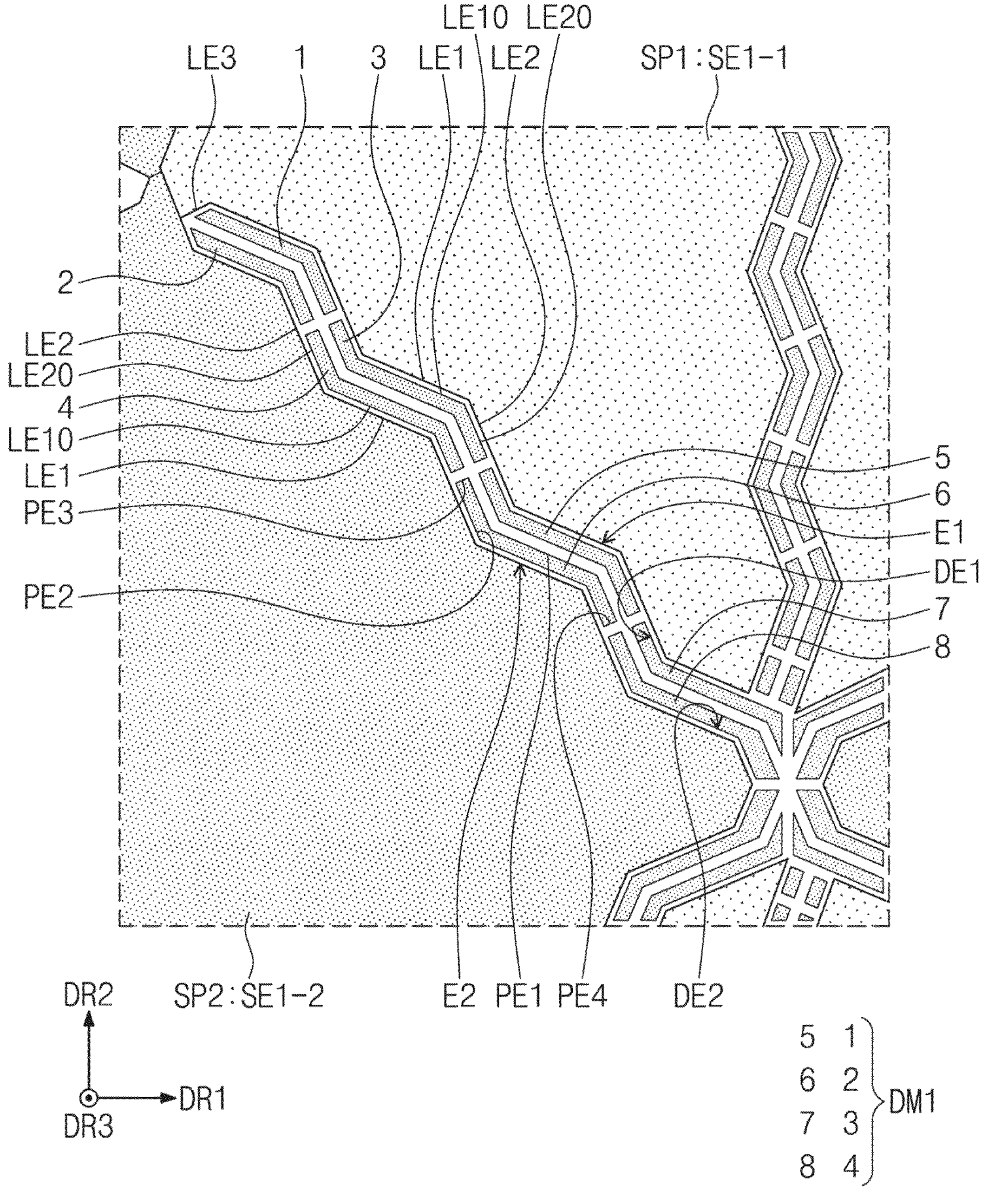
FIG. 4D is a plan view illustrating a partial area of the input sensor according to some embodiments of the present disclosure.
Figure 4E:
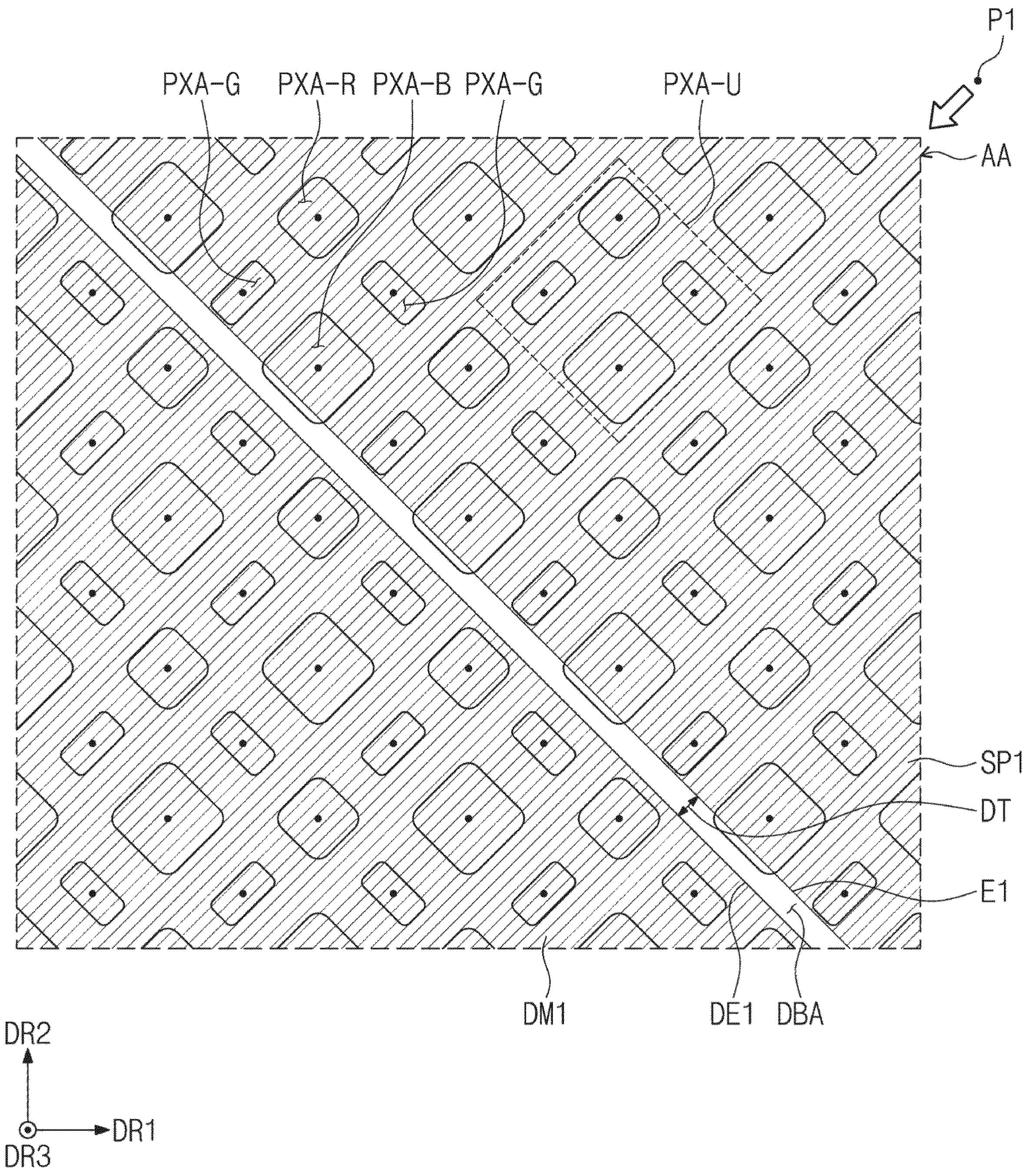
FIG. 4E is a plan view illustrating a partial area of an input sensor according to a comparative example.
Figure 4F:
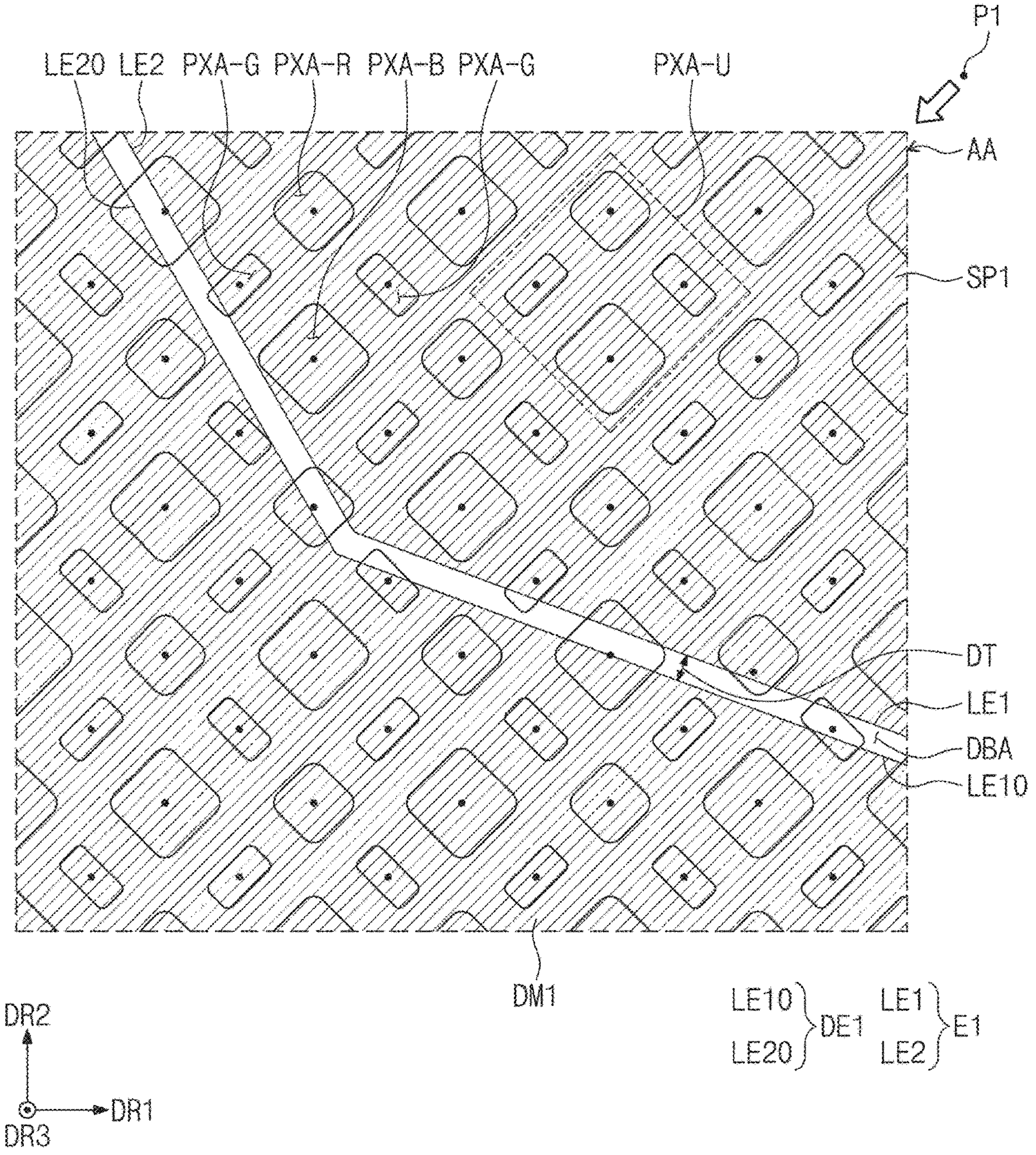
FIG. 4F is a plan view illustrating a partial area of the input sensor according to some embodiments of the present disclosure.
Figure 4G:
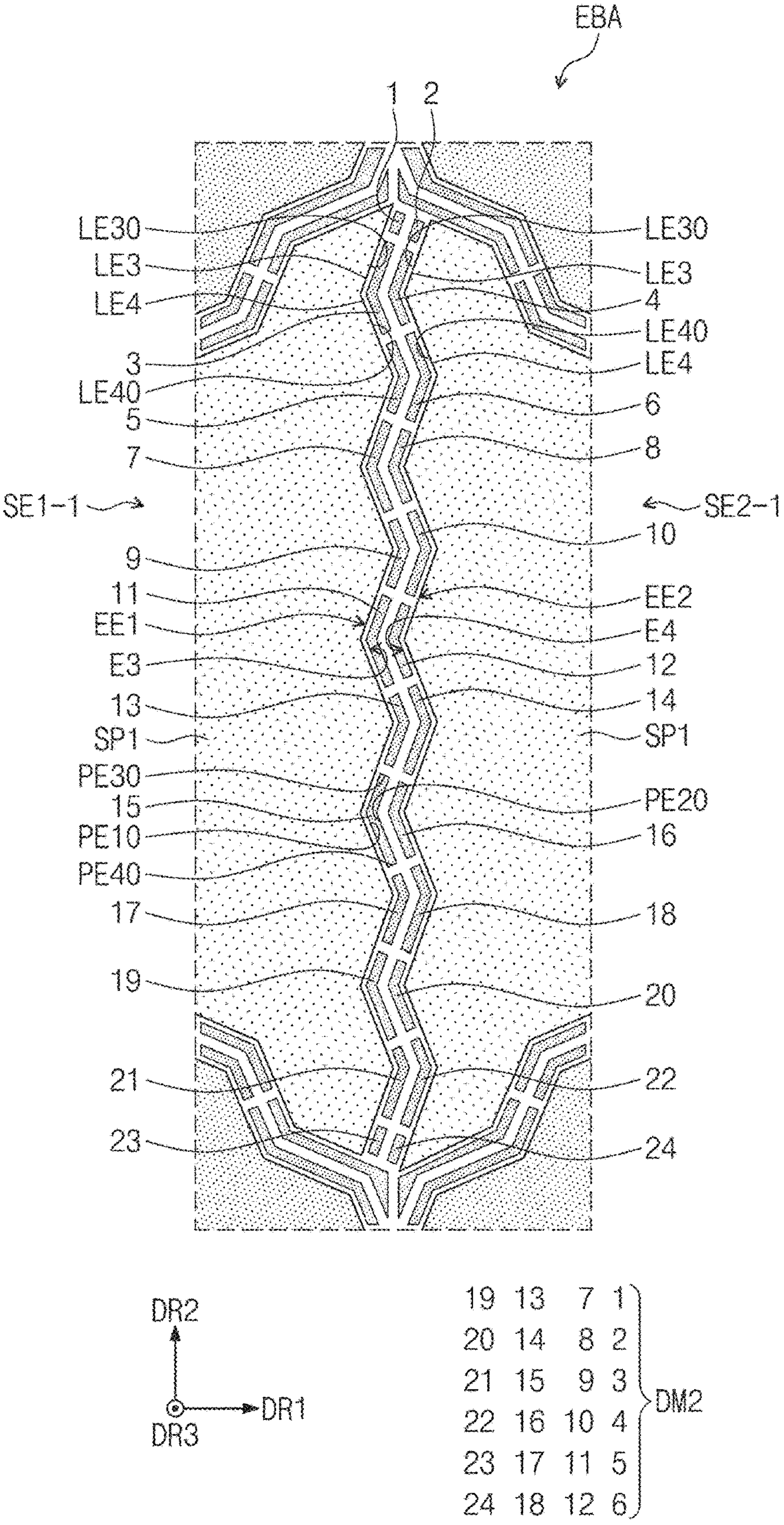
FIG. 4G is a plan view illustrating a partial area of the input sensor according to some embodiments of the present disclosure.

FIG. 4A is a plan view illustrating a partial area of the input sensor 220 according to some embodiments of the present disclosure. FIG. 4B is an enlarged plan view of a partial area of FIG. 4A. FIG. 4C is a sectional view corresponding to line III-III' in FIG. 4B. FIG. 4D is a plan view illustrating a partial area of the input sensor 220 according to some embodiments of the present disclosure. FIG. 4E is a plan view illustrating a partial area of an input sensor according to a comparative example. FIG. 4F is a plan view illustrating a partial area of the input sensor 220 according to some embodiments of the present disclosure. FIG. 4G is a plan view illustrating a partial area of the input sensor 220 according to some embodiments of the present disclosure. Hereinafter, the input sensor 220 will be described in detail with reference to FIGS. 4A to 4G together with FIG. 3.

In FIG. 4A, the boundary area between the first sensing area 220-AA1 and the second sensing area 220-AA2 illustrated in FIG. 3 and four unit areas US area illustrated. The intersection area of the first sensing electrodes SE1-1 and SE1-2 or the intersection area of the second sensing electrodes SE2-1 and SE2-2 is located in each of the unit areas UA.

Referring to FIG. 4A, one of the first-first sensing electrode SE1-1 and the first-second sensing electrode SE1-2 may have a one-body shape, and one of the second-first sensing electrode SE2-1 and the second-second sensing electrode SE2-2 may have a one-body shape. According to some embodiments, the first-second sensing electrode SE1-2 having a one-body shape and the second-second sensing electrode SE2-2 having a one-body shape are illustrated as an example.

Although the boundary between adjacent electrodes is illustrated only by a line in FIG. 4B, it should be understood that the adjacent electrodes are spaced apart from each other at the boundary. Referring to FIG. 4B, it can be seen that the first sensing parts SP1 and the first intermediate part BP1 are separated and distinguished from each other. Hereinafter, the first sensing parts SP1 will be described as a sensing pattern, and the first intermediate part BP1 will be described as a bridge. In addition, the intersection area of the first sensing electrodes SE1-1 and SE1-2 may be the same (or substantially the same) as the intersection area of the second sensing electrodes SE2-1 and SE2-2 illustrated in FIG. 4B.

The second-first sensing electrode SE2-1 may include a plurality of sensing patterns SP1 and bridges BP1, each of which is located between adjacent sensing patterns SP1 to electrically connect the adjacent sensing patterns SP1. One of the two adjacent sensing patterns may be defined as a first sensing pattern SP1-1, and the other may be defined as a second sensing pattern SP1-2. The first sensing pattern SP1-1 and the second sensing pattern SP1-2 are spaced apart from each other in the first direction DR1.

Because the second sensing parts SP2 and the second intermediate part BP2 have a one-body shape according to some embodiments, the boundaries between the second sensing parts SP2 and the second intermediate part BP2 are not distinguished. According to some embodiments, a portion of the second-second sensing electrode SE2-2 located between the first sensing pattern SP1-1 and the second sensing pattern SP1-2 in the first direction DR1 may be defined as the second intermediate part BP2. In FIG. 4B, the boundaries between the second sensing parts SP2 and the second intermediate part BP2 are illustrated by dotted lines.

In FIGS. 4B and 4C, two bridges BP1 are illustrated as an example. The number of bridges BP1 located in the unit area UA is not particularly limited. Each of the bridges BP1 may include a first bridge pattern B1, a second bridge pattern B2, and a third bridge pattern B3. Each of the first bridge pattern B1, the second bridge pattern B2, and the third bridge pattern B3 may be a conductive pattern. The first bridge pattern B1 is located on a layer different from the layer on which the second bridge pattern B2 and the third bridge pattern B3 are located. The first bridge pattern B1 may be located on the same layer as the sensing pattern SP1. The first bridge pattern B1 is located in an opening BP2-OP defined in the intermediate part BP2.

As illustrated in FIG. 4C, the second bridge pattern B2 and the third bridge pattern B3 are located on the encapsulation substrate 210-U. The second bridge pattern B2 and the third bridge pattern B3 may include a metal.

The second bridge pattern B2 and the third bridge pattern B3 may include a single metal layer or multiple metal layers. The second bridge pattern B2 and the third bridge pattern B3 may include a metal such as molybdenum (Mo), nickel (Ni), chromium (Cr), or titanium (Ti). The second bridge pattern B2 and the third bridge pattern B3 may include an alloy of the aforementioned metals or an alloy of the aforementioned metals and a metal other than the aforementioned metals.

The second bridge pattern B2 and the third bridge pattern B3 may include molybdenum (Mo) or a molybdenum alloy (Mo alloy). For example, the second bridge pattern B2 and the third bridge pattern B3 may include a molybdenum-niobium alloy (MoNb). The molybdenum (Mo) may increase the hardness of the bridge pattern, and the niobium (Nb) may relatively improve the corrosion resistance of the bridge pattern. The first-first signal lines SL1-1, the first-second signal lines SL1-2, the second-first signal lines SL2-1, and the second-second signal lines SL2-2 described with reference to FIG. 3 may be formed by the same process as the second bridge pattern B2, may include the same material as the second bridge pattern B2, and may have the same stacked structure as the second bridge pattern B2.

At least one insulating layer is located on the upper surface of the encapsulation substrate 210-U. A first insulating layer 221 may cover the second bridge pattern B2 and the third bridge pattern B3. The first sensing pattern SP1-1 and the second sensing pattern SP1-2 are located on the first insulating layer 221. The second intermediate part BP2 is located between the first sensing pattern SP1-1 and the second sensing pattern SP1-2. The first bridge pattern B1 is located in the opening BP2-OP of the second intermediate part BP2.

The first sensing pattern SP1-1 and the first bridge pattern B1 make contact with the second bridge pattern B2 through contact holes 221-TH penetrating the first insulating layer 221. The first bridge pattern B1 and the second sensing pattern SP1-2 make contact with the third bridge pattern B3 through contact holes 221-TH penetrating the first insulating layer 221.

The first sensing pattern SP1-1, the second sensing pattern SP1-2, the second intermediate part BP2, and the first bridge pattern B1 of FIGS. 4B and 4C may be formed through the same process, may include the same material, and may have the same stacked structure.

The first sensing pattern SP1-1, the second sensing pattern SP1-2, the second intermediate part BP2, and the first bridge pattern B1 may include transparent conductive oxide (TCO). The first sensing pattern SP1-1, the second sensing pattern SP1-2, the second intermediate part BP2, and the first bridge pattern B1 may include indium tin oxide (ITO), indium zinc oxide (IZO), zinc oxide (ZnO), or indium tin zinc oxide (ITZO).

As illustrated in FIG. 4C, a second insulating layer 222 is located on the first insulating layer 221. The second insulating layer 222 may cover the first sensing pattern SP1-1, the second sensing pattern SP1-2, the second intermediate part BP2, and the first bridge pattern B1. The first insulating layer 221 and the second insulating layer 222 may include an inorganic material or an organic material. According to some embodiments, the first insulating layer 221 and the second insulating layer 222 may include silicon oxide, silicon nitride, or silicon oxy nitride. According to some embodiments, each of the first insulating layer 221 and the second insulating layer 222 may be a silicon oxide layer. According to some embodiments, an inorganic layer may be additionally located between the upper surface of the encapsulation substrate 210-U and the second and third bridge patterns B2 and B3.

FIG. 4D illustrates the boundary area between the first-first sensing electrode SE1-1 and the first-second sensing electrode SE1-2. Although the boundary area is illustrated focusing on an edge E1 of the first sensing part SP1 and an edge E2 of the second sensing part SP2, it is apparent with reference to the rhombus-shaped first and second sensing parts SP1 and SP2 of FIG. 4A that the arrangement relationship between the edge E1 of the first sensing part SP1 and the edge E2 of the second sensing part SP2 illustrated in FIG. 4D is able to be identically applied to another edge of the first sensing part SP1 and another edge of the second sensing part SP2 opposite thereto. In addition, it is apparent with reference to FIG. 4A that the arrangement of the boundary area between the first-first sensing electrode SE1-1 and the first-second sensing electrode SE1-2 is able to be identically applied to the boundary area between the second-first sensing electrode SE2-1 and the second-second sensing electrode SE2-2.

The edge E1 of the first sensing part SP1 forms a portion of a side edge of the first-first sensing electrode SE1-1, and the edge E2 of the second sensing part SP2 forms a portion of a side edge of the first-second sensing electrode SE1-2. Accordingly, the following description of the edge E1 of the first sensing part SP1 may be identically applied to the side edge of the first-first sensing electrode SE1-1, and the following description of the edge E2 of the second sensing part SP2 may be identically applied to the side edge of the first-second sensing electrode SE1-2.

Hereinafter, the edge E1 of the first sensing part SP1 is defined as a first side edge E1, and the edge E2 of the second sensing part SP2 is defined as a second side edge E2. Referring to FIGS. 3 and 4A, the general first sensing part SP1 includes four first side edges E1, and the general second sensing part SP2 includes four second side edges E2. The first sensing part SP1 located at the distal end of the first-first sensing electrode SE1-1 includes two first side edges E1 and one distal edge EE1 (hereinafter, referred to as the first distal edge). The first sensing part SP1 located at the distal end of the second-first sensing electrode SE2-1 includes two first side edges E1 and one distal edge EE2 (hereinafter, referred to as the second distal edge).

Referring to FIG. 4D, a first dummy electrode DM1 is located between the first side edge E1 and the second side edge E2. The first dummy electrode DM1 may be an electrically isolated floating pattern. In FIG. 4A, the boundary between the first sensing part SP1 and the second sensing part SP2, the boundary between the first sensing part SP1 and the first dummy electrode DM1, and the boundary between the second sensing part SP2 and the first dummy electrode DM1 are illustrated only by boundary lines, and the boundaries are not illustrated in detail. In contrast, in FIG. 4D, the boundary between the first sensing part SP1 and the first dummy electrode DM1 and the boundary between the second sensing part SP2 and the first dummy electrode DM1 are illustrated as empty spaces.

The first dummy electrode DM1 includes a first edge DE1 facing the first side edge E1 and a second edge DE2 facing the first side edge E2. The first edge DE1 is located closer to the first side edge E1 than the second edge DE2 in the direction in which the first side edge E1 and the second side edge E2 are spaced apart from each other.

Each of the first side edge E1, the second side edge E2, the first edge DE1, and the second edge DE2 includes a first component LE1 or LE10 and a second component LE2 or LE20 crossing the first component LE1 or LE10. Each of the first side edge E1, the second side edge E2, the first edge DE1, and the second edge DE2 may include a plurality of first components LE1 or LE10 and a plurality of second component LE2 or LE20, and the plurality of first components LE1 or LE10 may alternate with the plurality of second component LE2 or LE20.

Each of the first side edge E1, the second side edge E2, the first edge DE1, and the second edge DE2 may further include another component extending in a direction crossing the first component LE1 or LE10 and the second component LE2 or LE20. In FIG. 4D, the first side edge E1 further including a third component LE3 is illustrated.

The first dummy electrode DM1 may include a plurality of dummy parts 1 to 8 spaced apart from one another. According to some embodiments, the first dummy electrode DM1 including eight dummy parts 1 to 8 is illustrated as an example.

When compared with a single shaped dummy electrode, the first dummy electrode DM1 including the plurality of dummy parts 1 to 8 may relatively reduce the amount of change in reference capacitance even though a process defect occurs. The reference capacitance refers to mutual capacitance formed between the first-first sensing electrode SE1-1 and the first-second sensing electrode SE1-2 when a process defect does not occur. When the dummy electrode having a one-body shape is short-circuited (connected) to one of the first-first sensing electrode SE1-1 and the first-second sensing electrode SE1-2 due to a process defect (hereinafter, referred to as the short-circuit defect), the mutual capacitance formed between the first-first sensing electrode SE1-1 and the first-second sensing electrode SE1-2 exceeds the reference capacitance by a significant amount. However, the plurality of dummy parts 1 to 8 may relatively reduce an increase in mutual capacitance even though a short circuit occurs. This is because each of the dummy parts 1 to 8 has a smaller area than the single shaped dummy electrode.

The odd-numbered dummy parts 1, 3, 5, and 7 are located closer to the first side edge E1 than to the second side edge E2 in the direction in which the first side edge E1 and the second side edge E2 are spaced apart from each other. The even-numbered dummy parts 2, 4, 6, and 8 are located closer to the second side edge E2 than to the first side edge E1.

Each of the dummy parts 1 to 8 includes a first partial edge PE1 and a second partial edge PE2 that face each other in the direction in which the first side edge E1 and the second side edge E2 are spaced apart from each other. The first partial edge PE1 is located closer to the first side edge E1 than to the second side edge E2, and the second partial edge PE2 is located closer to the second side edge E2 than to the first side edge E1. Each of the dummy parts 1 to 8 may further include a third partial edge PE3 and/or a fourth partial edge PE4 connecting the first partial edge PE1 and the second partial edge PE2.

The first partial edges PE1 of the odd-numbered dummy parts 1, 3, 5, and 7 may define the above-described first edge DE1, and the second partial edges PE2 of the even-numbered dummy parts 2, 4, 6, and 8 may define the above-described second edge DE2.

At least one of the first partial edges PE1 or the second partial edges PE2 may include at least one of the first component LE10 or the second component LE20. The first partial edge PE1 of one dummy part 3 among the odd-numbered dummy parts 1, 3, 5, and 7 may include one first component LE10 and two second components LE20. The first partial edge PE1 of another dummy part 1 among the odd-numbered dummy parts 1, 1, 5, and 7 may include one first component LE10 and one second component LE20.

FIGS. 4E and 4F illustrate the arrangement of the first sensing part SP1 and the first dummy electrode DM1 illustrated in FIG. 4D with respect to the active area AA of the display panel 210 illustrated in FIG. 2.

The active area AA of the display panel 210 may include a plurality of light emitting areas PXA-R, PXA-G, and PXA-B and a non-light emitting area NPXA located between the plurality of light emitting areas PXA-R, PXA-G, and PXA-B. Each of the pixels PX of FIG. 2 includes a corresponding light emitting area among the light emitting areas PXA-R, PXA-G, and PXA-B. The light emitting areas PXA-R, PXA-G, and PXA-B may be divided into three groups of light emitting areas PXA-R, PXA-G, and PXA-B. The three groups of light emitting areas PXA-R, PXA-G, and PXA-B may be distinguished from one another depending on the colors of source light generated by the light emitting elements of the pixels PX.

The first color light emitting area PXA-R, the second color light emitting area PXA-G, and the third color light emitting area PXA-B may have different areas. However, without being limited thereto, the first color light emitting area PXA-R, the second color light emitting area PXA-G, and the third color light emitting area PXA-B may have the same area. According to some embodiments, the first color may be red, the second color may be green, and the third color may be blue. According to some embodiments of the present disclosure, the display panel 210 may include three groups of light emitting areas that display three main colors: yellow, magenta, and cyan.

One first color light emitting area PXA-R, two second color light emitting areas PXA-G, and one third color light emitting area PXA-B define a light emitting unit PXA-U. Light emitting units PXA-U may be arranged according to a rule (e.g., a set or predetermined rule) in the active area AA.

As illustrated in FIGS. 4E and 4F, the plurality of first sensing electrodes SE1-1 and SE1-2 and the plurality of second sensing electrodes SE2-1 and SE2-2 of FIG. 3 overlap corresponding light emitting areas among the plurality of light emitting areas PXA-R, PXA-G, and PXA-B. In FIGS. 4E, and 4F, the first sensing part SP1 is illustrated on behalf of the plurality of first sensing electrodes SE1-1 and SE1-2 and the plurality of second sensing electrodes SE2-1 and SE2-2. The first side edge E1 of the first sensing part SP1 overlaps corresponding light emitting areas among the plurality of light emitting areas PXA-R, PXA-G, and PXA-B.

The first dummy electrode DM1 also overlaps corresponding light emitting areas among the plurality of light emitting areas PXA-R, PXA-G, and PXA-B. The first edge DE1 of the first dummy electrode DM1 also overlaps corresponding light emitting areas among the plurality of light emitting areas PXA-R, PXA-G, and PXA-B. According to some embodiments, the first edge DE1 of the first dummy electrode DM1 may not overlap the light emitting areas PXA-R, PXA-G, and PXA-B.

FIG. 4E illustrates the comparative example. Each of the first side edge E1 of the first sensing part SP1 and the first edge DE1 of the first dummy electrode DM1 is implemented with one straight line. The first dummy electrode DM1 and the first sensing part SP1 are uniformly spaced apart from each other by a gap (e.g., a set or predetermined gap) DT. The area corresponding to the gap (e.g., the set or predetermined gap) DT may be defined as a dummy boundary area DBA.

According to the comparative example, when the active area AA of FIG. 4E is viewed from a measurement point P1 having an azimuth angle of 45° and a viewing angle (e.g., a set or predetermined viewing angle), an interference pattern may occur depending on the viewing angle. That is, a moire phenomenon may occur. Here, the viewing angle may range from 30° to 45°. Hereinafter, the cause of the moire phenomenon will be described in more detail.

A light loss that occurs when source light generated from the plurality of light emitting areas PXA-R, PXA-G, and PXA-B passes through the first sensing part SP1 and the first dummy electrode DM1 (hereinafter, referred to as the first light loss) is different from a light loss that occurs when the source light passes through the dummy boundary area BBA (hereinafter, referred to as the second light loss). When the second light loss is less than the first light loss and the active area AA of FIG. 4E is viewed from the measurement point P1 having an azimuth angle of 45° and a specific viewing angle, the dummy boundary area DBA between the first dummy electrode DM1 and the first sensing part SP1 appears brighter.

When each of the first side edge E1 and the first edge DE1 is implemented with a straight line and extends in a diagonal direction (in a direction inclined at an angle of 45° with respect to the horizontal axis) like the plurality of light emitting areas PXA-R, PXA-G, and PXA-B, the light emitting areas PXA-R, PXA-G, and PXA-B are arranged to overlap the dummy boundary area DBA according to a rule (e.g., a set or predetermined rule). As illustrated in FIG. 4E, only the third color light emitting areas PXA-B may overlap the dummy boundary area DBA when viewed from above the plane (or in a plan view).

When the active area AA is viewed from the measurement point P1, which has an azimuth angle of 45° and a viewing angle (e.g., a set or predetermined viewing angle), at different viewing angles, the amount of source light of the third color transmitted to the measurement point P1 through the dummy boundary area DBA may vary greatly depending on the viewing angles. Therefore, the moire phenomenon in which the source light generated from the plurality of light emitting areas PXA-R, PXA-G, PXA-B forms a specific pattern and the pattern is recognized in different colors depending on the viewing angles occurs.

FIG. 4F illustrates further details of some embodiments of the present disclosure. The first dummy electrode DM1 illustrated in FIG. 4F may be one of the odd-numbered dummy parts 1, 3, 5, and 7 illustrated in FIG. 4D. According to some embodiments, the above-described moire phenomenon may be relatively reduced. Hereinafter, detailed description thereabout will be given.

The first side edge E1 may include the first component LE1 and the second component LE2, and the first edge DE1 may include the first component LE10 and the second component LE20 that correspond to the first component LE1 and the second component LE2. The gap DT between the first side edge E1 and the first edge DE1 may remain constant.

The first components LE1 and LE10 may form an included angle of 34° (or about) 34° (hereinafter, referred to as the first included angle) with a reference axis, and the second components LE2 and LE20 may form an included angle of 56° (or about) 56° (hereinafter, referred to as the second included angle) with the reference axis. The reference axis may be the vertical axis or an axis parallel to the first direction DR1. The slopes of the first components LE1 and LE10 and the second components LE2 and LE20 with respect to the reference axis may be selected to minimize or relatively reduce the overlapping areas between the dummy boundary area DBA and the light emitting areas PXA-R, PXA-G, and PXA-B. Accordingly, the slopes of the first components LE1 and LE10 and the second components LE2 and LE20 with respect to the reference axis are not limited to the aforementioned numerical values and may vary depending on the arrangement of the light emitting areas PXA-R, PXA-G, and PXA-B.

The overlapping areas between the dummy boundary area DBA and the light emitting areas PXA-R, PXA-G, and PXA-B and/or the arrangement of the light emitting areas PXA-R, PXA-G, and PXA-B overlapping the dummy boundary area DBA may vary depending on the slopes of the first components LE1 and LE10 and the second components LE2 and LE20. According to some embodiments, light emitting areas overlapping a partial area of the dummy boundary area DBA corresponding to the first components LE1 and LE10 may be the first color light emitting area PXA-R, the second color light emitting area PXA-G, and the third color light emitting area PXA-B, and light emitting areas overlapping a partial area of the dummy boundary area DBA corresponding to the second components LE2 and LE20 may also be the first color light emitting area PXA-R, the second color light emitting area PXA-G, and the third color light emitting area PXA-B. However, on the plane (or in a plan view), the arrangement and areas of the first color light emitting area PXA-R, the second color light emitting area PXA-G, and the third color light emitting area PXA-B that overlap the dummy boundary area DBA corresponding to the first components LE1 and LE10 may be different from the arrangement and areas of the first color light emitting area PXA-R, the second color light emitting area PXA-G, and the third color light emitting area PXA-B that overlap the dummy boundary area DBA corresponding to the second components LE2 and LE20.

According to some embodiments, when the active area AA is viewed from the measurement point P1, which has an azimuth angle of 45° and a viewing angle (e.g., a set or predetermined viewing angle), at different viewing angles, source light of a specific color generated from a specific light emitting area is not absolutely transmitted in large amounts to the measurement point P1 through the dummy boundary area DBA. In addition, even though source light of a specific color provided from the dummy boundary area DBA corresponding to the first components LE1 and LE10 is decreased at a specific viewing angle, the source light of the specific color provided from the dummy boundary area DBA corresponding to the second components LE2 and LE20 may be increased, and thus the amount of the source light of the specific color provided through the entire dummy boundary area DBA may be maintained at a constant level irrespective of the viewing angle. Accordingly, the moire phenomenon may be relatively reduced.

FIG. 4G illustrates the boundary area EBA between the first-first sensing electrode SE1-1 and the second-first sensing electrode SE2-1 facing each other in the first direction DR1. The area between a first distal edge EE1 and a second distal edge EE2 spaced apart from each other is defined as the boundary area EBA between the first-first sensing electrode SE1-1 and the second-first sensing electrode SE2-1.

A second dummy electrode DM2 is located between the first distal edge EE1 and the second distal edge EE2. The second dummy electrode DM2 may be an electrically isolated floating pattern. The second dummy electrode DM2 includes a third edge DE3 facing the first distal edge EE1 and a fourth edge DE4 facing the second distal edge EE2. The third edge DE3 is located closer to the first distal edge EE1 than the second edge DE2 in the direction in which the first distal edge EE1 and the second distal edge EE2 are spaced apart from each other.

Each of the first distal edge EE1, the second distal edge EE2, the third edge DE3, and the fourth edge DE4 includes a third component LE3 or LE30 and a fourth component LE4 or LE40 crossing the third component LE3 or LE30. Each of the first distal edge EE1, the second distal edge EE2, the third edge DE3, and the fourth edge DE4 may include a plurality of third components LE3 or LE30 and a plurality of fourth component LE4 or LE40, and the plurality of third components LE3 or LE30 may alternate with the plurality of fourth component LE4 or LE40. Each of the first distal edge EE1, the second distal edge EE2, the third edge DE3, and the fourth edge DE4 may further include another component extending in a direction crossing the third component LE3 or LE30 and the fourth component LE4 or LE40.

According to some embodiments, each of the first distal edge EE1, the second distal edge EE2, the third edge DE3, and the fourth edge DE4 may overlap corresponding light emitting areas among the plurality of light emitting areas PXA-R, PXA-G, and PXA-B, like the first side edge E1 or the first edge DE1 of FIG. 4F.

The second dummy electrode DM2 may include a plurality of dummy parts 1 to 24 spaced apart from one another. According to some embodiments, the second dummy electrode DM2 including 24 dummy parts 1 to 24 is illustrated as an example. The odd-numbered dummy parts are located closer to the first distal edge EE1 than to the second distal edge EE2 in the direction in which the first distal edge EE1 and the second distal edge EE2 are spaced apart from each other. The even-numbered dummy parts are located closer to the second distal edge EE2 than to the first distal edge EE1.

Each of the dummy parts 1 to 24 includes a first partial edge PE10 and a second partial edge PE20 that face each other in the direction in which the first distal edge EE1 and the second distal edge EE2 are spaced apart from each other. The first partial edge PE10 is located closer to the first distal edge EE1 than to the second distal edge EE2, and the second partial edge PE20 is located closer to the second distal edge EE2 than to the first distal edge EE1. Each of the dummy parts 1 to 24 may further include a third partial edge PE30 and/or a fourth partial edge PE40 connecting the first partial edge PE10 and the second partial edge PE20.

The first partial edges PE10 of the odd-numbered dummy parts define the third edge E3, and the second partial edges PE20 of the even-numbered dummy parts define the fourth edge E4. At least one of the first partial edges PE10 or the second partial edges PE20 may include at least one of the third component LE30 or the fourth component LE40. The first partial edge PE10 of one dummy part among the odd-numbered dummy parts may include one third component LE30 and one fourth component LE40. The first partial edge PE10 of at least one other dummy part 1 or 23 among the odd-numbered dummy parts may include only one third component LE30.

The first distal edge EE1, the second distal edge EE2, the third edge DE3, and the fourth edge DE4, each of which includes the third component LE3 or LE30 and the fourth component LE4 or LE40 described with reference to FIG. 4G, may relatively reduce the moire phenomenon on the same principle as the first side edge E1 and the first edge DE1 described with reference to FIG. 4F.

The third components LE3 and LE30 may form a predetermined included angle (hereinafter, referred to as the third included angle) with the reference axis, and the fourth components LE4 and LE40 may form a predetermined included angle (hereinafter, referred to as the fourth included angle) with the reference axis. The difference between the fourth included angle and the third included angle may be the same as the difference between the second included angle and the first included angle described with reference to FIG. 4F. The difference between the fourth included angle and the third included angle may be 22°. The fourth included angle and the third included angle may be 102° and 80°, respectively, but are not particularly limited.

Figure 5A:
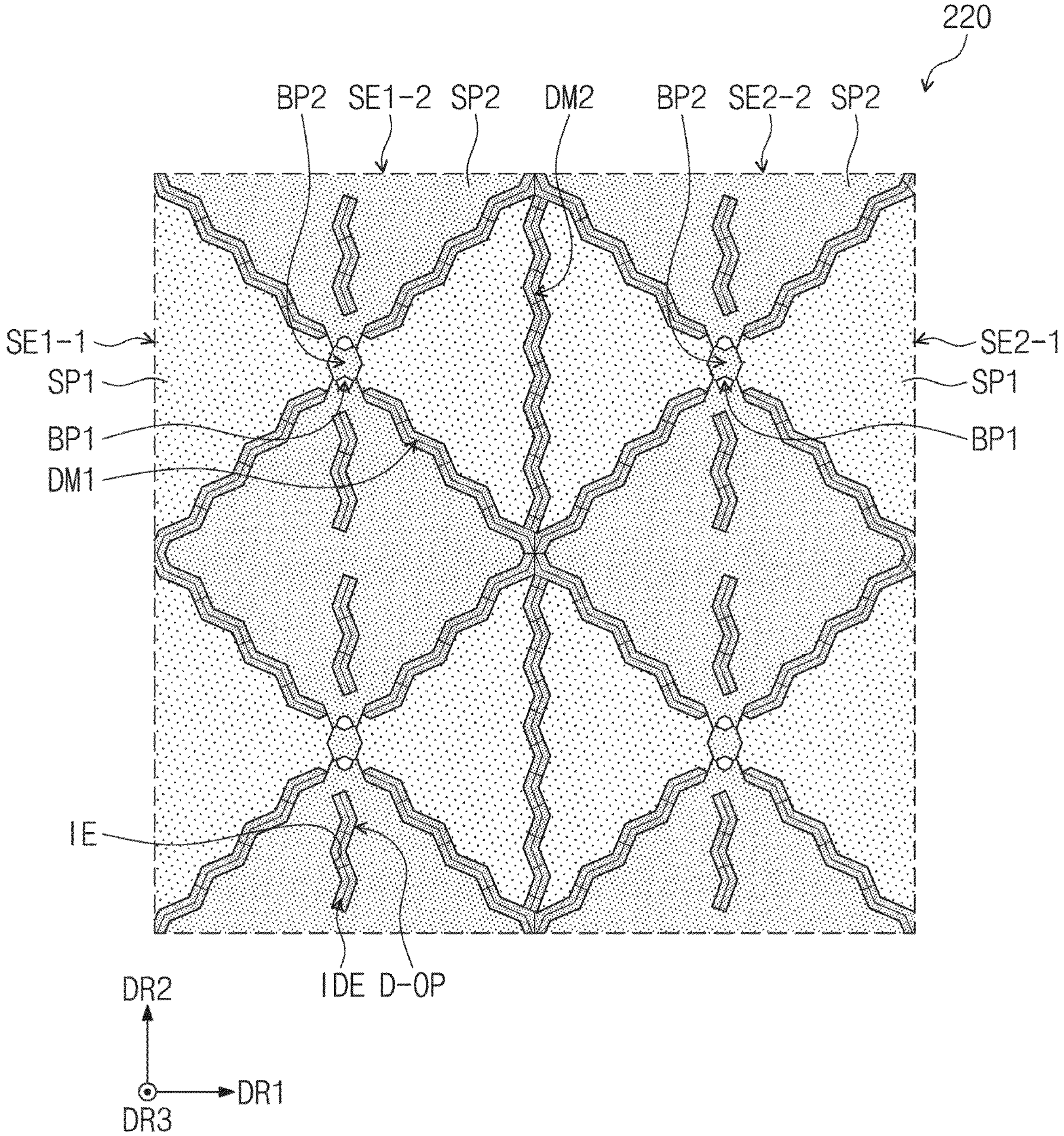
FIG. 5A is a plan view illustrating a partial area of the input sensor according to some embodiments of the present disclosure.
Figure 5B:
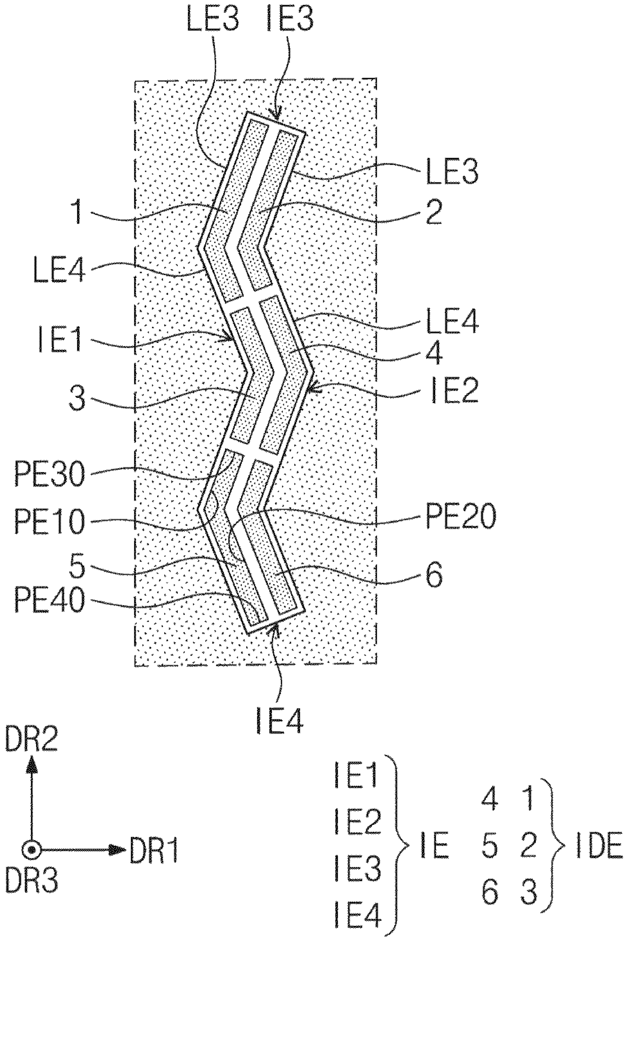
FIG. 5B is an enlarged plan view of a portion of FIG. 5A.

FIG. 5A is a plan view illustrating a partial area of the input sensor 220 according to some embodiments of the present disclosure. FIG. 5B is an enlarged plan view of a portion of FIG. 5A. FIG. 5A illustrates a plan view corresponding to FIG. 4A. Hereinafter, detailed description of components identical to the components described with reference to FIGS. 4A to 4G refers to the description of FIGS. 4A to 4G.

According to some embodiments, a dummy opening D-OP may be defined in at least one of the first-first sensing electrodes SE1-1, the first-second sensing electrodes SE1-2, the second-first sensing electrodes SE2-1, or the second-second sensing electrodes SE2-2. The dummy opening D-OP is defined by an inner edge IE. In FIG. 5A, the first-second sensing electrodes SE1-2 and the second-second sensing electrodes SE2-2, each of which has the dummy opening D-OP formed therein, are illustrated as an example.

As illustrated in FIGS. 5A and 5B, an inner dummy electrode IDE may be located in the dummy opening D-OP. The relationship between the dummy opening D-OP and the inner dummy electrode IDE may be the same (or substantially the same) as the relationship between the boundary area EBA and the second dummy electrode DM2 located in the boundary area EBA described with reference to FIG. 4G.

The dummy openings D-OP may have the same shapes as portions of the boundary area EBA. One of the dummy openings D-OP may have the same shape as one portion of the boundary area EBA, and another one of the dummy openings D-OP may have the same shape as another portion of the boundary area EBA. The dummy openings D-OP are not limited to having the same shape.

The inner edge IE includes a first partial edge IE1 and a second partial edge IE2 that correspond to the first distal edge EE1 and the second distal edge EE2, respectively, which are illustrated in FIG. 4G. The inner edge IE may further include a third partial edge IE3 and/or a fourth partial edge IE4 connecting the first partial edge IE1 and the second partial edge IE2.

Each of the first partial edge IE1 and the second partial edge IE2 may include a third component LE3 and a fourth component LE4, like the first distal edge EE1 and the second distal edge EE2 illustrated in FIG. 4G.

The inner dummy electrode IDE may include a plurality of dummy parts 1 to 6 spaced apart from one another.

According to some embodiments, the inner dummy electrode IDE including six dummy parts 1 to 6 is illustrated as an example. The odd-numbered dummy parts 1, 3, and 5 are located closer to the first partial edge IE1 than to the second partial edge IE2 in the direction in which the first partial edge IE1 and the second partial edge IE2 are spaced apart from each other. The even-numbered dummy parts 2, 4, and 6 are located closer to the second partial edge IE2 than to the first partial edge IE1.

Each of the dummy parts 1 to 6 includes a first partial edge PE10 and a second partial edge PE20 that face each other in the direction in which the first partial edge IE1 and the second partial edge IE2 are spaced apart from each other. The first partial edge PE10 is located closer to the first partial edge IE1 than to the second partial edge IE2, and the second partial edge PE20 is located closer to the second partial edge IE2 than to the first partial edge IE1. Each of the dummy parts 1 to 6 may further include edges connecting the first partial edge PE10 and the second partial edge PE20. The first partial edge PE10 and the second partial edge PE20 may include a third component LE30 and a fourth component LE40.

Figure 6:
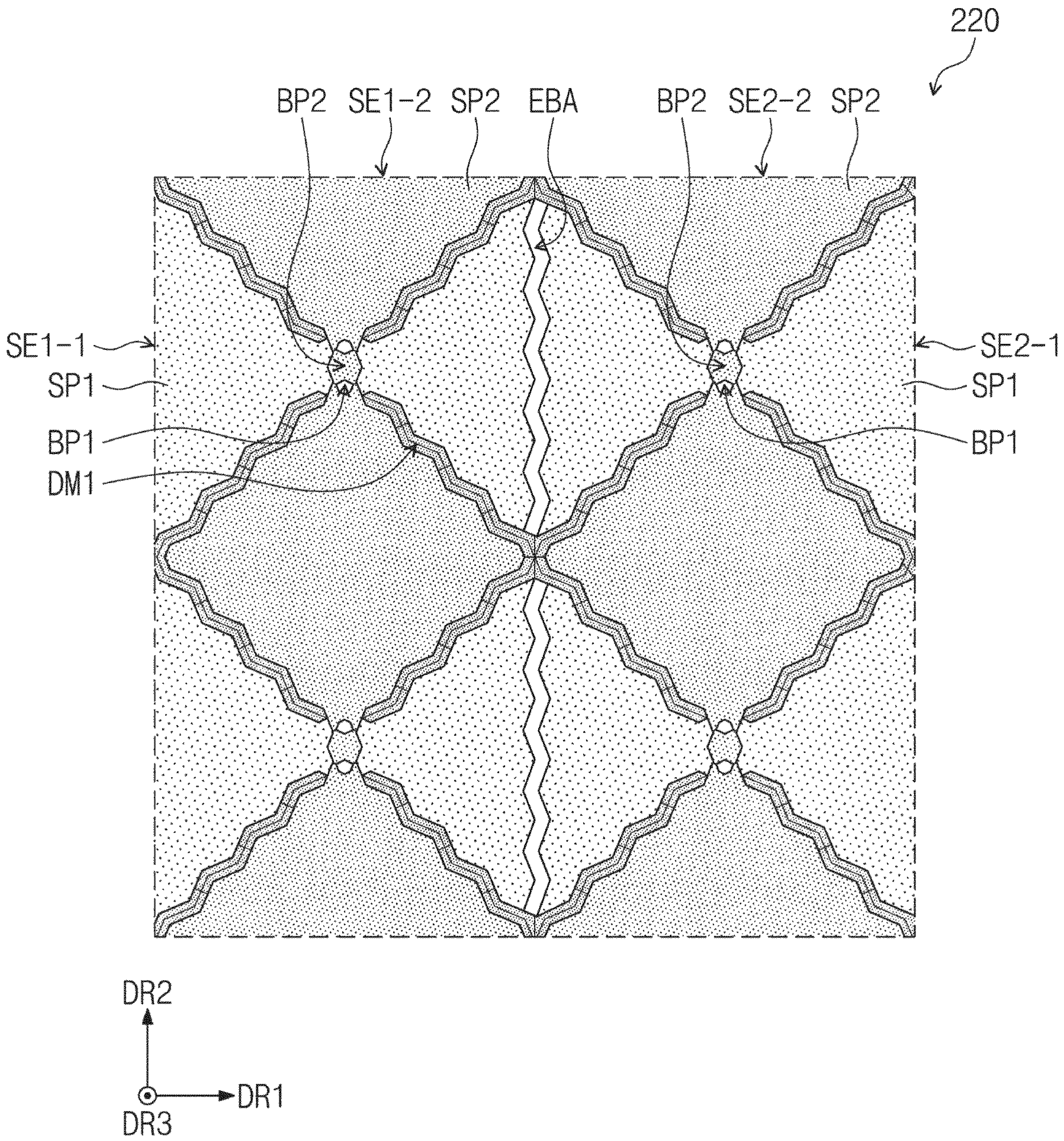
FIG. 6 is a plan view illustrating a partial area of the input sensor according to some embodiments of the present disclosure.
Figure 7:
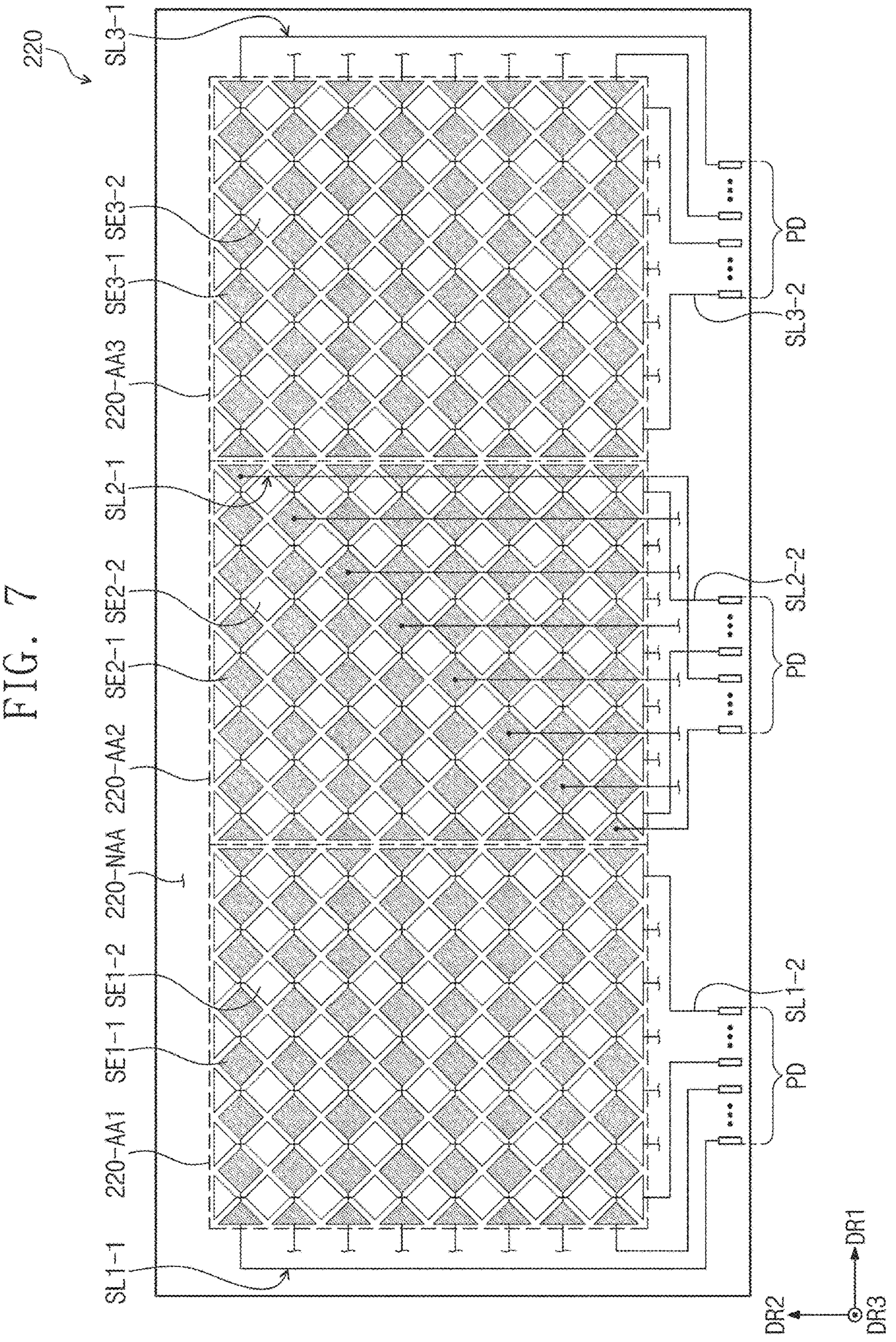
FIG. 7 is a plan view of the input sensor according to some embodiments of the present disclosure.

FIG. 6 is a plan view illustrating a partial area of the input sensor 220 according to some embodiments of the present disclosure. FIG. 7 is a plan view of the input sensor 220 according to some embodiments of the present disclosure. FIG. 6 illustrates a plan view corresponding to FIG. 4A, and FIG. 7 illustrates a plan view corresponding to FIG. 3. Hereinafter, detailed description of components identical to the components described with reference to FIGS. 3 and 4A refers to the description of FIGS. 3 and 4A.

Referring to FIG. 6, the second dummy electrode DM2 described with reference to FIG. 4G may not be located in the boundary area EBA. When the boundary area EBA is formed to be narrower than that illustrated in FIG. 4G, the boundary area EBA may be similar to the dummy boundary area DBA of FIG. 4F, and the moire phenomenon may be relatively reduced for the same reason as that described with reference to FIG. 4F.

Referring to FIG. 7, a third sensing area 220-AA3 may be additionally located on one side of the second sensing area 220-AA2 located far away from the first sensing area 220-AA1. A third-first sensing electrode SE3-1 and a third-second sensing electrode SE3-2 crossing the third-first sensing electrode SE3-1 are located in the third sensing area 220-AA3. The input sensor 220 may include a third-first signal line SL3-1 connected to the third-first sensing electrode SE3-1 and a third-second signal line SL3-2 connected to the third-second sensing electrode SE3-2. The third-first signal line SL3-1 and the third-second signal line SL3-2 may be located in the non-sensing area 220-NAA.

The boundary area between the second sensing area 220-AA2 and the third sensing area 220-AA3 may be the same (or substantially the same) as the boundary between the first-first sensing electrode SE1-1 of the first sensing area 220-AA1 and the second-first sensing electrode SE2-1 of the second sensing area 220-AA2 described with reference to FIG. 4G. The second-first signal line SL2-1 connected to the second-first sensing electrode SE2-1 may overlap the second sensing area 220-AA2.

A luminance difference may occur between the areas where the sensing electrodes overlap the light emitting areas and the non-overlapping areas. The edges of the sensing electrodes that define the boundary area between the sensing electrodes may include two types of components, and thus the moire phenomenon may be relatively reduced.

The dummy electrode may include the plurality of dummy parts, and thus a decrease in sensing sensitivity caused by a short circuit between the sensing electrode and the dummy electrode may be suppressed.

While the present disclosure has been described with reference to embodiments thereof, it will be apparent to those of ordinary skill in the art that various changes and modifications may be made thereto without departing from the spirit and scope of the present disclosure as set forth in the following claims, and their equivalents.

What is claimed is:

1. A display device comprising:

a display panel including first color light emitting areas, second color light emitting areas, third color light emitting areas, and a non-light emitting area around the first to third color light emitting areas; and an input sensor on the display panel, the input sensor including a first sensing area and a second sensing area, wherein the input sensor includes:

a first-first sensing electrode in the first sensing area and overlapping corresponding light emitting areas among the first to third color light emitting areas;

a first-second sensing electrode in the first sensing area and crossing the first-first sensing electrode;

a second-first sensing electrode in the second sensing area and spaced apart from the first-first sensing electrode;

a second-second sensing electrode in the second sensing area and crossing the second-first sensing electrode; and a first dummy electrode between a first side edge of the first-first sensing electrode and a first side edge of the first-second sensing electrode, wherein the first dummy electrode includes a first edge facing the first side edge of the first-first sensing electrode, and each of the first side edge of the first-first sensing electrode and the first edge of the first dummy electrode includes a first component extending in a first direction and a second component extending in a second direction different from the first direction and crossing the first direction, and wherein each of a first distal edge of the first-first sensing electrode and a second distal edge of the second-first sensing electrode facing each other includes a third component and a fourth component extending in a direction crossing the third component.

2. The display device of claim 1, wherein the first dummy electrode includes a plurality of dummy parts spaced apart from one another, and wherein an edge of at least one dummy part among the plurality of dummy parts includes the first component and the second component.

3. The display device of claim 1, wherein the first dummy electrode includes a second edge facing the first side edge of the first-second sensing electrode, and wherein each of the second edge of the first dummy electrode and the first side edge of the first-second sensing electrode includes the first component and the second component.

4. The display device of claim 1, wherein the first side edge of the first-first sensing electrode includes a plurality of first components and a plurality of second components, and wherein the plurality of first components and the plurality of second components of the first side edge of the first-first sensing electrode alternate with one another.

5. The display device of claim 1, further comprising:

a second dummy electrode between the first distal edge and the second distal edge, wherein the second dummy electrode includes a third edge facing the first distal edge, and the third edge includes the third component and the fourth component.

6. The display device of claim 5, wherein the second dummy electrode further includes a fourth edge facing the second distal edge, and wherein each of the fourth edge and the second distal edge includes the third component and the fourth component.

7. The display device of claim 5, wherein the first-first sensing electrode and the second dummy electrode include transparent conductive oxide.

8. The display device of claim 5, wherein the second dummy electrode includes a plurality of dummy parts spaced apart from one another, and wherein an edge of at least one dummy part among the plurality of dummy parts includes the third component and the fourth component.

9. The display device of claim 1, wherein each of the first side edge of the first-first sensing electrode and the first side edge of the first-second sensing electrode overlaps corresponding light emitting areas among the first to third color light emitting areas, and wherein each of the first distal edge and the second distal edge overlaps corresponding light emitting areas among the first to third color light emitting areas.

10. The display device of claim 1, wherein the first-first sensing electrode and the first dummy electrode include transparent conductive oxide.

11. The display device of claim 1, wherein the first-first sensing electrode or the first-second sensing electrode includes an inner edge defining a dummy opening in an inside of the first-first sensing electrode or the first-second sensing electrode, and wherein the inner edge includes the third component and the fourth component.

12. The display device of claim 11, further comprising:

an inner dummy electrode in the dummy opening.

13. The display device of claim 12, wherein an edge of the inner dummy electrode facing the inner edge includes the third component and the fourth component.

14. The display device of claim 1, wherein a difference between included angles of the first component and the second component with respect to a reference axis is equal to a difference between included angles of the third component and the fourth component with respect to the reference axis.

15. The display device of claim 1, further comprising:

a first sensor drive circuit electrically connected to the first-first sensing electrode and the first-second sensing electrode; and a second sensor drive circuit electrically connected to the second-first sensing electrode and the second-second sensing electrode.

16. An electronic device comprising:

a display device, wherein the display device comprises:

a display panel including first color light emitting areas, second color light emitting areas, third color light emitting areas, and a non-light emitting area around the first to third color light emitting areas; and an input sensor on the display panel, the input sensor including a first sensing area and a second sensing area, wherein the input sensor includes:

a first-first sensing electrode in the first sensing area and overlapping corresponding light emitting areas among the first to third color light emitting areas;

a first-second sensing electrode in the first sensing area and crossing the first-first sensing electrode;

a second-first sensing electrode in the second sensing area and spaced apart from the first-first sensing electrode;

a second-second sensing electrode in the second sensing area and crossing the second-first sensing electrode; and a first dummy electrode between a first side edge of the first-first sensing electrode and a first side edge of the first-second sensing electrode, wherein the first dummy electrode includes a first edge facing the first side edge of the first-first sensing electrode, and each of the first side edge of the first-first sensing electrode and the first edge of the first dummy electrode includes a first component extending in a first direction and a second component extending in a second direction different from the first direction and crossing the first direction, and wherein each of a first distal edge of the first-first sensing electrode and a second distal edge of the second-first sensing electrode facing each other includes a third component and a fourth component extending in a direction crossing the third component.

17. A display device comprising:

a display panel including first color light emitting areas, second color light emitting areas, third color light emitting areas, and a non-light emitting area around the first to third color light emitting areas; and an input sensor on the display panel, the input sensor including a first sensing area and a second sensing area, wherein the input sensor includes:

a first-first sensing electrode in the first sensing area and overlapping corresponding light emitting areas among the first to third color light emitting areas;

a second-first sensing electrode in the second sensing area and spaced apart from the first-first sensing electrode; and a dummy electrode between a first distal edge of the first-first sensing electrode and a second distal edge of the second-first sensing electrode facing each other, wherein each of the first distal edge and the second distal edge includes a first component extending in a first direction and a second component extending in a second direction different from the first direction and crossing the first direction, and wherein the dummy electrode includes a first edge facing the first distal edge, and the first edge of the dummy electrode includes the first component and the second component.

18. The display device of claim 17, wherein the dummy electrode includes a second edge facing the second distal edge, and the second edge of the dummy electrode includes the first component and the second component.

19. The display device of claim 17, wherein the first-first sensing electrode, the second-first sensing electrode, and the dummy electrode include transparent conductive oxide.

20. The display device of claim 17, wherein the first distal edge, the second distal edge, and the first edge of the dummy electrode overlap corresponding light emitting areas among the first to third color light emitting areas.

* * * * *